(12) United States Patent
Tatsumi et al.

(10) Patent No.: US 11,080,192 B2
(45) Date of Patent: Aug. 3, 2021

(54) STORAGE SYSTEM AND STORAGE CONTROL METHOD

(71) Applicant: Hitachi, Ltd., Tokyo (JP)

(72) Inventors: Ryosuke Tatsumi, Tokyo (JP); Shintaro Ito, Tokyo (JP); Masakuni Agetsuma, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/552,512

(22) PCT Filed: May 14, 2015

(86) PCT No.: PCT/JP2015/063950
§ 371 (c)(1),
(2) Date: Aug. 22, 2017

(87) PCT Pub. No.: WO2016/181562
PCT Pub. Date: Nov. 17, 2016

(65) Prior Publication Data
US 2018/0052772 A1 Feb. 22, 2018

(51) Int. Cl.
*G06F 12/0846* (2016.01)
*G06F 3/06* (2006.01)
(Continued)

(52) U.S. Cl.
CPC ............ *G06F 12/0848* (2013.01); *G06F 3/06* (2013.01); *G06F 3/0644* (2013.01);
(Continued)

(58) Field of Classification Search
CPC . G06F 7/00; G06F 12/16; G06F 13/00; G06F 15/00; G06F 9/22
(Continued)

(56) References Cited

U.S. PATENT DOCUMENTS 3,757,306 A * 9/1973 Boone ...................... G06F 7/501
327/564
8,341,348 B2 * 12/2012 Yoshii ................... G06F 3/0631
711/113

(Continued)

FOREIGN PATENT DOCUMENTS

| JP | 09-146842 A | 6/1997 |
| JP | 2004-139349 A | 5/2004 |
| JP | 2012-533781 A | 12/2012 |

OTHER PUBLICATIONS

Parallel and Distributed Processing and Applications—ISPA 2005. Li, Bignag, et al. "A Cluster LVM for SAN Environments." Parallel and Distributed Processing and Applications—ISPA 2005. Nov. 2-5, 2005 pp. 149-158. (Year: 2005).*

(Continued)

*Primary Examiner* — Michael Krofcheck
*Assistant Examiner* — John Francis Wojton
(74) *Attorney, Agent, or Firm* — Mattingly & Malur, PC

(57) ABSTRACT

The storage system includes a first partition which is associated with a first processor and in which the first processor temporarily stores data relating to I/O requests processed by the first processor; and a second partition which is associated with a second processor and in which the second processor temporarily stores data relating to I/O requests processed by the second processor. Each processor independently controls the size of the first partition of the first cache memory and the size of the first partition of the second cache memory, and also independently controls the size of the second partition of the first cache memory and the size of the second partition of the second cache memory.

13 Claims, 25 Drawing Sheets

(51) Int. Cl.
*G06F 12/0871* (2016.01)
*G11C 7/10* (2006.01)

(52) U.S. Cl.
CPC ........ *G06F 3/0659* (2013.01); *G06F 12/0871* (2013.01); *G11C 7/1084* (2013.01)

(58) Field of Classification Search
USPC ....... 711/113, 118, 162, 120, 192; 340/172.5
See application file for complete search history.

(56) References Cited

U.S. PATENT DOCUMENTS

| | | | | |
|---|---|---|---|---|
| 8,769,201 | B2* | 7/2014 | Hasenplaugh | G06F 9/5016 711/118 |
| 2004/0078518 | A1 | 4/2004 | Kuwata | |
| 2004/0268044 | A1* | 12/2004 | Heller, Jr. | G06F 12/0824 711/118 |
| 2008/0005614 | A1* | 1/2008 | Lubbers | G06F 11/2092 714/11 |
| 2008/0147932 | A1* | 6/2008 | Fukazawa | G06F 11/2089 710/74 |
| 2010/0332761 | A1* | 12/2010 | Li | G06F 12/0893 711/129 |
| 2011/0191547 | A1 | 8/2011 | Yoshii et al. | |
| 2013/0282998 | A1* | 10/2013 | Tatsumi | G06F 11/1456 711/162 |

OTHER PUBLICATIONS

IBM System / 360 Operating System. IBM Systems Reference Library, File No. S360-20 GC28-6535-7 (1970). (Year: 1970).*
Microsoft Fifth Edition, 2002 (1 page ).*
Mittal, Sparsh. A Survey of Techniques for Cache Partitioning in Multicore Processors. Oak Ridge National Laboratory (2017) (Year: 2017).*
International Search Report of PCT/JP2015/063950 dated Jun. 30, 2015.

* cited by examiner

300 — Drive table

| Drive number (301) | Parity group number (302) | RAID level (303) | Drive capacity (304) | Drive type (305) |
|---|---|---|---|---|
| 1 | 1 | RAID 5 (3D1P) | 400 GB | SSD |
| 2 | 2 | RAID 5 (7D1P) | 200 GB | SAS |
| 3 | 3 | RAID 6 (6D2P) | 1 TB | NL-SAS |
| 4 | 4 | RAID 1 (2D2D) | 200 GB | SSD |
| 5 | 1 | RAID 5 (3D1P) | 400 GB | SSD |

Segment table — 330

| Segment number (331) | Logical VOL number (332) | Block number (333) | Node number (334) | Forward node number (335) | Reverse node number (336) | Segment attribute (337) | Dirty bit map (338) | Controller number (339) |
|---|---|---|---|---|---|---|---|---|
| 1 | NULL | NULL | 1 | 52 | 12 | Free | 00000000 | 1 |
| 2 | 2 | 1 | 2 | 3 | MRU | Clean | 00000000 | 1 |
| 3 | 1 | 1 | 3 | 27 | 2 | Clean | 00000000 | 2 |
| 4 | 3 | 4 | 4 | LRU | 5 | Dirty | 00100040 | 2 |
| 5 | 4 | 5 | 5 | 4 | 35 | Dirty | 10080022 | 1 |

Configuration of connection queue

| Attribute table 320 | | | | |
|---|---|---|---|---|
| Processor number 321 | Controller number 322 | Segment attribute 323 | MRU node number 324 | LRU node number 325 |
| 1 | 1 | Clean | 2 | 121 |
| 1 | 1 | Dirty | 9 | 61 |
| 1 | 1 | Free | 98 | 22 |
| 1 | 2 | Clean | 34 | 89 |
| 1 | 2 | Dirty | 83 | 4 |
| ⋮ | | | | |
| NULL | 2 | Shared free | 231 | 356 |

Fig. 10

|  | | 340 | |
|---|---|---|---|
| Cache directory | | | |
| 341 | 342 | 343 | 344 |
| Logical VOL number | Block number | 1st node number | 2nd node number |
| 1 | 1 | 3 | NULL |
| 1 | 2 | NULL | NULL |
| 1 | 3 | 20 | 15 |
| 2 | 1 | 2 | NULL |
| 2 | 2 | 45 | 51 |

| Shared free table | | |
|---|---|---|
| 371 | 372 | 373 |
| Controller number | Number of shared free segments | Shared free segment threshold |
| 1 | 100 | 50 |
| 2 | 110 | 50 |

I/O command management table

| I/O command management number | I/O in-process flag | I/O command-receiving controller number | I/O command type |
|---|---|---|---|
| 1 | OFF | NULL | NULL |
| 2 | ON | 1 | ZZZ |
| 3 | ON | 1 | YYY |
| 4 | ON | 2 | XXX |

STORAGE SYSTEM AND STORAGE CONTROL METHOD

TECHNICAL FIELD

The present invention generally relates to storage control and relates to, for example, storage system technology.

BACKGROUND ART

In relation to a computer system which is constituted by an MPPK (MP Package) including a local memory and a plurality of MPs (Micro Processors) and a CMPK including a shared memory and a cache memory and which controls input/output of data to/from a storage apparatus from/to a host computer, PTL 1 discloses the following technique. In order to prevent an imbalance from occurring in a distribution of control functions necessary for input/output control of data among the plurality of MPs even when a control authority of an MP is migrated to another MP and control information necessary for an MP to perform a data input/output process is migrated from the shared memory to a local memory of the MP, necessary control functions are released from an MP and the released control functions are allocated to other MPs.

CITATION LIST

Patent Literature

[PTL 1]
Japanese Translation of PCT Application No. 2012-533781

SUMMARY OF INVENTION

Technical Problem

In a storage system in which each of a plurality of controllers includes a cache memory and in which the controllers are coupled with each other, when a certain controller receives an I/O (Input/Output) request and cache data satisfying the I/O request exists in a cache memory of a controller other than the certain controller, the cache data must be transferred to the certain controller from the other controller. This process may cause a decline in I/O performance of the storage system.

In consideration thereof, an object of the present invention is to reduce, in a storage system in which each of a plurality of controllers includes a cache memory and in which the controllers are coupled with each other, transfer of cache data among the controllers. Another object of the present invention is to improve a utilization efficiency of cache memories and to improve I/O performance in the storage system.

Solution to Problem

A storage system according to an embodiment of the present invention includes first and second processors, first and second cache memories, first and second host interfaces capable of bidirectionally communicating with a host computer, and a storage drive.

A latency from the first host interface to the first cache memory is less than a latency from the first host interface to the second cache memory.

A latency from the second host interface to the second cache memory is less than a latency from the second host interface to the first cache memory.

Each of the first and second cache memories includes: a first partition which is associated with the first processor and in which the first processor temporarily stores data relating to I/O requests processed by the first processor; and a second partition which is associated with the second processor and in which the second processor temporarily stores data relating to I/O requests processed by the second processor.

At least one of the first and second processors independently controls a size of the first partition of the first cache memory and a size of the first partition of the second cache memory and independently controls a size of the second partition of the first cache memory and a size of the second partition of the second cache memory.

Advantageous Effects of Invention

According to the present invention, in a storage system in which each of a plurality of controllers includes a cache memory and in which the controllers are coupled with each other, transfer of cache data among the controllers can be reduced. In addition, according to the present invention, a utilization efficiency of cache memories can be improved and I/O performance can be improved in the storage system.

BRIEF DESCRIPTION OF DRAWINGS

FIG. 6 shows a configuration example of a drive table.
FIG. 8 shows a configuration example of a segment table.
FIG. 10 shows a configuration example of an attribute table.
FIG. 11 shows a configuration example of a cache directory.
FIG. 14 shows a configuration example of a shared free table.
FIG. 15 shows a configuration example of an I/O command management table.

DESCRIPTION OF EMBODIMENTS

Hereinafter, an embodiment will be described. Although information will be described below using expressions such as an "xxx table", an "xxx queue", and an "xxx list", information may be expressed using any kind of data structure. In other words, an "xxx table", an "xxx queue", or an "xxx list" can also be referred to as "xxx information" in order to demonstrate that information is not dependent on data structure.

In addition, while a "program" is sometimes used as a subject when describing a process in the following description, since a program causes a prescribed process to be performed while using at least one of a storage resource (for example, a memory) and a communication interface device as appropriate by being executed by a processor (for example, a CPU (Central Processing Unit)), a processor or an apparatus including the processor may be used as a subject of processing. A process performed by a processor may be partially or entirely performed by a hardware circuit. A computer program may be installed from a program source. The program source may be a program distribution server or a storage medium (for example, a portable storage medium).

Furthermore, in the following description, a set of one or more computers which manages at least one or more apparatuses included in a computer system may be referred to as a "management system". When a management computer displays display information, the management computer may constitute a management system. In addition, a combination of a management computer and a display computer may also constitute a management system. Furthermore, processes identical or similar to those of a management computer may be realized by a plurality of computers in order to increase speed or reliability of a management process. In this case, the plurality of computers may constitute a management system (when a display computer performs display, the display computer may also be included). In the present example, a management computer constitutes a management system. Moreover, a management computer displaying information may signify displaying information on a display device included in the management computer or transmitting display information to a display computer (for example, a client) being coupled with the management computer (for example, a server). In the case of the latter, information represented by the display information is displayed by the display computer on the display device included in the display computer.

Furthermore, in the following description, when describing elements of a same type while distinguishing the elements from one another, reference signs such as "xxx 11a", "xxx 11b", "xxx 172-1", and "xxx 172-2" will be used. However, when describing elements of a same type without distinguishing the elements from one another, only a shared number among the reference signs such as "xxx 11" and "xxx 172" may be used.

Embodiment 1

Figure 1:
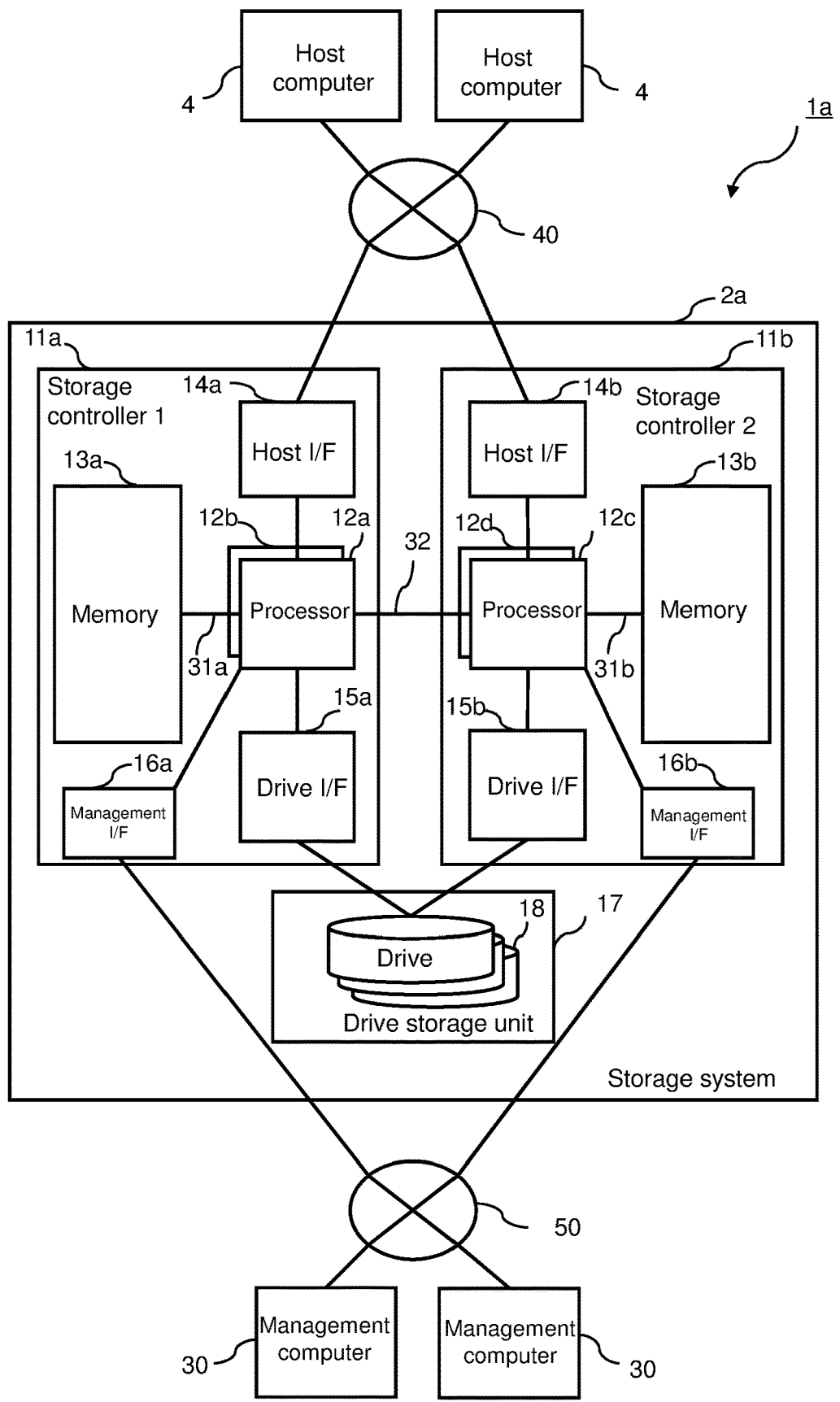
FIG. 1 shows a configuration example of a computer system according to Embodiment 1.

FIG. 1 shows a configuration example of a computer system 1a according to Embodiment 1.

The computer system 1a includes a storage system 2a, a host computer 4, and a management computer 30. The host computer 4 and the storage system 2 are coupled via an external network 40 so as to be capable of bidirectional communication. The management computer 30 and the storage system 2a are coupled via a management network 50 so as to be capable of bidirectional communication. The storage system 2a, the host computer 4, and the management computer 30 may be respectively provided in plurality. The management computer 30 may be referred to as a management system.

The storage system 2a includes a plurality of storage controllers (hereinafter, referred to as "controllers") 11a and 11b. The controllers 11a and 11b include microprocessors (hereinafter, referred to as a "processor") 12a and 12b, memories 13a and 13b, host I/Fs 14a and 14b, drive I/Fs 15a and 15b, and management I/Fs 16a and 16b. The elements 11a to 16a are coupled via an internal bus 31a and elements 11b to 16b are coupled via an internal bus 31b so as to be capable of bidirectional communication. The elements 11a to 16a and 11b to 16b may be respectively provided in plurality.

The controllers 11a and 11b are coupled via an inter-controller path 32 so as to be capable of bidirectional communication. In other words, processors 12a and 12b or a DMA (Direct Memory Access) circuit (not shown) included in the controller 11a are not only capable of accessing a memory 13a included in the controller 11a but are also capable of accessing, via the inter-controller path 32, a memory 13b included in the controller 11b. Conversely, processors 12c and 12d or a DMA circuit (not shown) included in the controller 11b are not only capable of accessing the memory 13b included in the controller 11b but are also capable of accessing, via the inter-controller path 32, the memory 13a included in the controller 11a.

A latency from a host I/F 14a (a drive I/F 15a) to the memory 13a is less than a latency from the host I/F 14a (the drive I/F 15a) to the memory 13b. In addition, a latency from a host I/F 14b (a drive I/F 15b) to the memory 13b is less than a latency from the host I/F 14b (the drive I/F 15b) to the memory 13a. In other words, the latency from the host I/Fs 14a and 14b (the drive I/Fs 15a and 15b) to the memories 13a and 13b in the same one of the controllers 11a and 11b is less than the latency from the same host I/Fs 14ab and 14b (the drive I/Fs 15a and 15b) to the memories 13b and 13a in another one of the controllers 11b and 11a via the inter-controller path 32, respectively. This is due to the fact that, the shorter a physical distance between the host I/Fs 14a and 14b (the drive I/Fs 15a and 15b) and the memories 13a and 13b, the shorter the latency and vice versa. Another factor is that an access speed to the memories 13a and 13b of another one of the controllers 11b and 11a, respectively, is limited by a maximum communication speed (a maximum communication bandwidth) of the inter-controller path 32.

When the processors 12a-12d are multi-core processors, some of the cores in the processors 12a-12d may be grouped. In addition, the controllers 11a and 11b may include a plurality of logical processors.

The host I/Fs 14a and 14b are I/F devices for coupling the controllers 11a and 11b to the external network 40, respectively. When internal paths 31a and 31b are PCIe (PCI-Express) and the external network 40 is a SAN (Storage Area Network), the host I/Fs 14a and 14b may be adapters that translate between a PCIe protocol and a Fibre Channel protocol.

The management I/Fs 16a and 16b are I/F devices for coupling the controllers 11a and 11b to the management network 50, respectively. When the internal paths 31a and 31b are PCIe and the management network 50 is a LAN (Local Area Network), the management I/Fs 16a and 16b may be adapters that translate between a PCIe protocol and an IP protocol.

The drive I/Fs 15a and 15b are I/F devices for coupling the controllers 11a and 11b and a drive 18, which is a type of a storage device, to each other, respectively. When the internal paths 31a and 31b are PCIe and an I/F of the drive 18 uses a Fibre Channel protocol, the drive I/Fs 15a and 15b may be adapters that translate between a PCIe protocol and the Fibre Channel protocol.

The storage system 2a includes a drive storage unit 17. The drive storage unit 17 may store a plurality of drives 18. Examples of the drives 18 include an HDD (Hard Disk Drive), an SSD (Solid State Drive), and a tape-type storage device.

The controllers 11a and 11b may configure a logical VOL using a storage area of one or more drives 18. The controllers 11a and 11b may configure a RAID (Redundant Array of Independent Disks) group using a plurality of drives 18 and configure a logical VOL using the RAID group. The controllers 11a and 11b may provide the host computers 4 with a logical VOL as an LU (Logical Unit). Upon receiving a write request from one of the host computers 4, one of the controllers 11a or 11b writes data to an address of a logical VOL specified by the write request. Upon receiving a read request from one of the host computers 4, one of the controllers 11a or 11b reads data from an address of a logical VOL specified by the read request and returns the data to the host computer 4. One of the processors 12a-12d in charge of I/O processes with respect to a logical VOL may be determined for each logical VOL.

Figure 2:
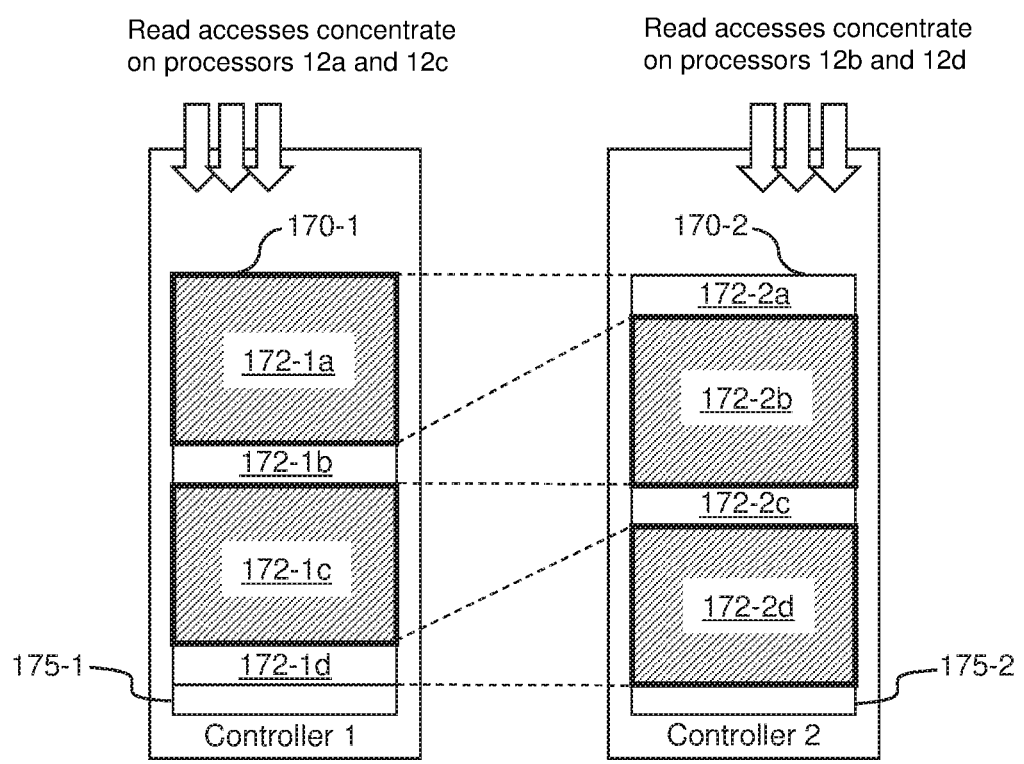
FIG. 2 shows an outline of Embodiment 1.

FIG. 2 shows an outline of Embodiment 1.

The controller 11a includes a cache memory area 170-1 in the memory 13a and the controller 11b includes a cache memory area 170-2 in the memory 13b.

A cache memory areas 170-1 and 170-2 is constituted by a plurality of segments. A segment may be an area with a prescribed size. The cache memory areas 170-1 and 170-2 may be managed and controlled (read, written, deleted, and the like) in segment units.

The cache memory area 170-1 in the controller 11a may include a partition 172-1a reserved for the processor 12a, a partition 172-1b reserved for the processor 12b, a partition 172-1c reserved for the processor 12c, a partition 172-1d reserved for the processor 12d, and a partition 175-1 not reserved for any of the processors 12. The cache memory area 170-2 in the controller 11b may include a partition 172-2a reserved for the processor 12a, a partition 172-2b reserved for the processor 12b, a partition 172-2c reserved for the processor 12c, a partition 172-2d reserved for the processor 12d, and a partition 175-2 not reserved for any of the processors. The partitions 175-1 and 175-2 not reserved for any of the processors 12 may each be referred to as a "shared free partition". Each partition may be constituted by a plurality of segments. A segment of the shared free partitions 175-1 and 175-2 may be referred to as a "shared free segment".

The controller 11a or 11b, having received a read request from the host computer 4, stores cache data relating to the read request in the cache memory area 170-1 or 170-2 of the memory 13a or 13b of the controller 11a or 11b itself. Let us suppose that the controller 11a receives, in a concentrated manner, read requests with respect to logical VOLs for which the processor 12a and the processor 12c are in charge of I/O processes. In this case, the controller 11a (the host I/F 14a or the drive I/F 15a) stores cache data in the partitions 172-1a and 172-1c of the cache memory area 170-1 in the controller 11a itself. In addition, let us suppose that the controller 11b receives, in a concentrated manner, read requests with respect to logical VOLs for which the processor 12b and the processor 12d are in charge of I/O processes. In this case, the controller 11b (the host I/F 14b or the drive I/F 15b) stores cache data in the partitions 172-2b and 172-2d of the cache memory area 170-2 in the controller 11b itself. Assuming that a size of each partition 172-1a to 172-2d is fixed, cache data in the partitions 172-1b and 172-1d does not contribute at all to the concentrated read requests to the controller 11a, and cache data in the partitions 172-2a and 172-2c does not contribute at all to the concentrated read requests to the controller 11b. In other words, a utilization efficiency of the cache memory area 170-1 and 170-2 in each controller 11a and 11b is low.

In consideration thereof, in the present embodiment, each controller 11a and 11b independently controls and manages a size of each partition 172-1a to 172-2d in the cache memory areas 170-1 and 170-2 of each of the controllers 11a and 11b itself. In addition, each controller 11a and 11b dynamically changes the size of each partition 172-1a to 172-2d in the cache memory area 170-1 and 170-2 of the controllers 11a and 11b by itself. For example, with respect to the concentrated read requests to the controller 11a described above, sizes of the partitions 172-1b and 172-1d are reduced and sizes of the partitions 172-1a and 172-1c are enlarged in the cache memory area 170-1 of the controller 11a. In addition, with respect to the concentrated read requests to the controller 11b described above, sizes of the partitions 172-2a and 172-2c are reduced and sizes of the partitions 172-2b and 172-2d are enlarged in the cache memory area 170-2 of the controller 11b.

Accordingly, the utilization efficiency of the cache memory area 170-1 and 170-2 of each controller 11a and 11b is improved. In addition, due to the improvement in the utilization efficiency of the cache memory areas 170-1 and 170-2, a cache hit rate of the controller 11a or 11b having received the read request may also improve. Furthermore, since the controller 11a or 11b stores cache data in the cache memory area 170-1 or 170-2 of the controller 11 itself, transfer of cache data via the inter-controller path 32 does not occur (or is reduced). Data transfer via the inter-controller path 32 is one of the factors which may cause response performance and throughput performance of the storage system 2a to decline. Therefore, according to the present embodiment, since data transfer via the inter-controller path 32 in the storage system 2a may be reduced, the response performance and the throughput performance of the storage system 2a may be improved.

Figure 3:
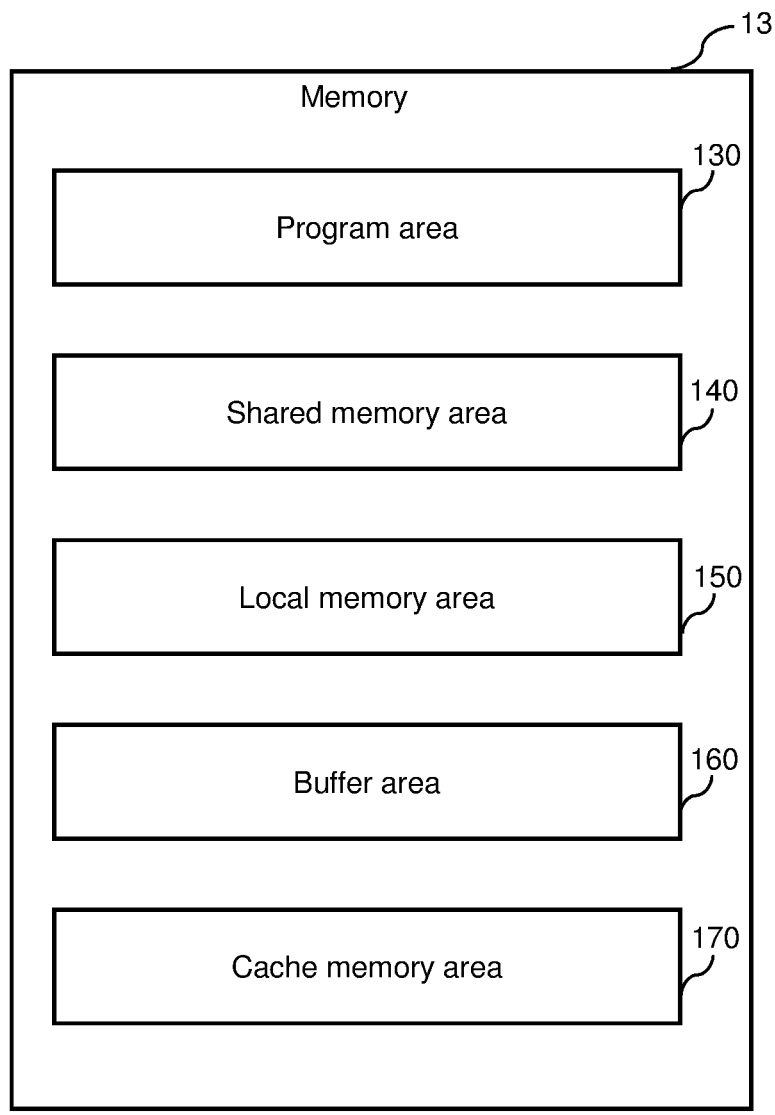
FIG. 3 shows an example of respective areas included in a memory.

FIG. 3 shows an example of each area included in the memory 13 (corresponding to memory 13a or 13b in FIG. 1).

The memory 13a or 13b may include a program area 130, a shared memory area 140, a local memory area 150, a buffer area 160, and the cache memory area 170 (corresponding to cache memory area 170-1 or 170-2 in FIG. 2).

The program area 130 stores programs to be executed by the processors 12a-12d. Examples of the programs stored in the program area 130 will be described later (refer to FIG. 4).

The shared memory area 140 stores information used in a shared manner by the processors 12a-12d of each controller 11a or 11b. Examples of the information stored in the shared memory area 140 will be described later (refer to FIG. 5).

The local memory area 150 may store information used only by the processors 12a-12d in the controllers 11a or 11b which includes the memory 13a or 13b. Examples of the information stored in the local memory area 150 will be described later (refer to FIG. 5).

The buffer area 160 may temporarily store cache data transferred among the respective elements 12a to 16b in the controllers 11a or 11b or among the controllers 11a and 11b.

The cache memory area 170 may store, as cache data, read data from a logical VOL and/or write data to the logical VOL. The cache memory area 170 stores cache data in order to reduce a response time of the storage system 2a with respect to the host computers 4.

Figure 4:
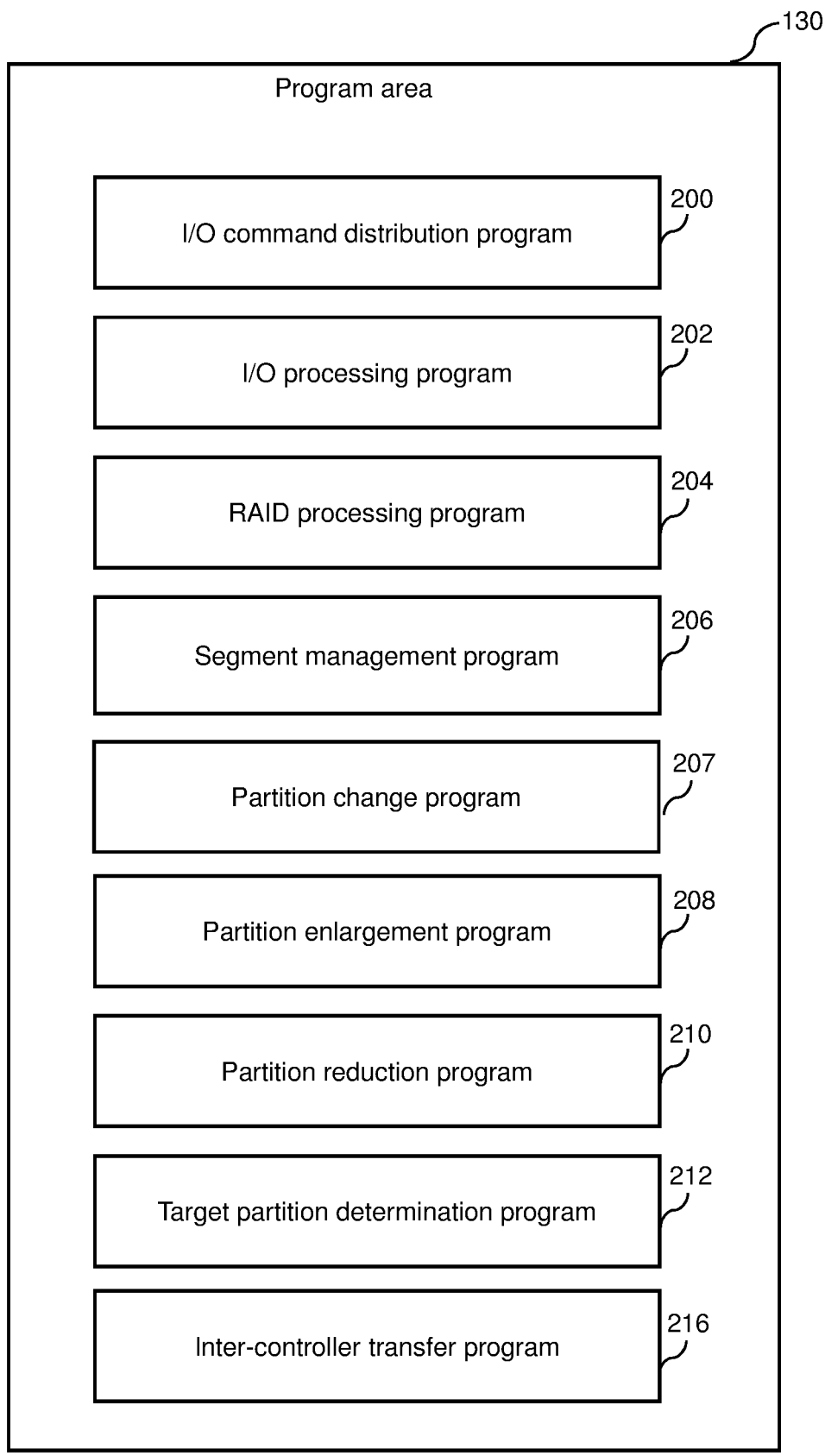
FIG. 4 shows an example of programs stored in a program area.

FIG. 4 shows an example of programs stored in the program area 130.

The program area 130 may include an I/O command distribution program 200, an I/O processing program 202, a RAID processing program 204, a segment management program 206, a partition change program 207, a partition enlargement program 208, a partition reduction program 210, a target partition determination program 212, and an inter-controller transfer program 216. These programs may be executed by any of the processors 12a-12d.

The I/O command distribution program 200 distributes a read request (or a write request) transmitted from one of the host computer 4s to one of the processors 12a-12d in charge of an I/O process of a logical VOL that is a request destination of the read request. The I/O command distribution program 200 may be executed by the processor 12a or 12b (or 12c or 12d) in the same controller 11a (or 11b) as the host I/F 14a (or 14b) having received the read request (or the write request) transmitted from one of the host computers 4. An example of execution of the I/O command distribution program 200 will be described later (refer to FIG. 16).

The I/O processing program 202 identifies a read destination of a logical VOL from a read request distributed by the I/O command distribution program 200 and reads data from the identified read destination. In addition, the I/O processing program 202 may return the read data to one of the host computers 4 that is an issuance source of the read request. Furthermore, the I/O processing program 202 identifies a write destination of a logical VOL from a distributed write request and writes data to the identified write destination. In addition, the I/O processing program 202 may return a result of the write process to one of the host computers 4 that is an issuance source of the write request. The I/O processing program 202 may be executed by one of the processors 12a or 12b (or 12c or 12d) in the same controller 11a (or 11b) as the host I/F 14a (or 14b) having received the read request (or the write request) transmitted from one of the host computers 4 or may be executed by the processor 12c or 12d (or 12a or 12b) in another controller 11b (or 11a). An example of execution of the I/O processing program 202 will be described later (refer to FIGS. 17, 18, and 19).

During a read and/or a write, when necessary, the RAID processing program 204 copies (stages) data in the drives 18 to the cache memory area 170-1 or 170-2 and stores (destages) data in the cache memory area 170-1 or 170-2 in the drive 18.

The segment management program 206 controls and manages segments in the cache memory area 170-1 and 170-2. The segment management program 206 may change a shared free segment into a segment of a certain partition or may change a segment of a certain partition into a shared free segment. An example of execution of the segment management program 206 will be described later (refer to FIG. 20).

The target partition determination program 212 determines a target size of each partition 172a-1a to 172-2d in the cache memory areas 170-1 and 170-2. A size of each partition 172a-1a to 172-2d may be changed so as to conform to the target size determined by the target partition determination program 212. The target size may be expressed as the number of segments. The target size of each partition 172a-1a to 172-2d may be determined based on a state of the storage system 2a or may be configured by a manager in advance. For example, the target size of each partition 172a-1a to 172-2d may be determined based on a stay time of a clean segment (refer to description of FIG. 8), a read hit IOPS, a policy defined by the manager, a combination thereof, or the like. The target partition determination program 212 may compare segment allocation frequencies 363 (refer to FIG. 13) corresponding to the respective partitions 172a-1a to 172-2d in the same cache memory areas 170-1 and 170-2 and determine the target size of each partition 172a-1a to 172-2d so as to enlarge a partition 172a-1a to 172-2d with a higher segment allocation frequency 363 and reduce another partition 172a-1a to 172-2d with a lower segment allocation frequency 363.

The partition change program 207 changes (enlarges or reduces) a size of each partition 172a-1a to 172-2d in the cache memory area 170-1 and 170-2 of each memory 13a and 13b so as to conform to the target size of each partition 172a-1a to 172-2d determined by the target partition determination program 212. An example of execution of the partition change program 207 will be described later (refer to FIG. 22). The partition change program 207 may first reduce a size of a certain partition and then enlarge a size of another partition in the same cache memory areas 170-1 and 170-2.

When the size of a partition 172a-1a to 172-2d is smaller than the target size determined by the target partition determination program 212, the partition enlargement program 208 enlarges the size of that partition 172a-1a to 172-2d so that the size becomes closer to the target size. The partition enlargement program 208 may be called from the partition change program 207. An example of execution of the partition enlargement program 208 will be described later (refer to FIG. 24).

When the size of a partition 172a-1a to 172-2d is larger than the target size determined by the target partition determination program 212, the partition reduction program 210 reduces the size of that partition 172a-1a to 172-2d so that the size becomes closer to the target size. The partition reduction program 210 may be called from the partition change program 207. An example of execution of the partition reduction program 208 will be described later (refer to FIG. 23).

The inter-controller transfer program 216 controls transfer of cache data between the controllers 11a and 11b via the inter-controller path 32.

Figure 5:
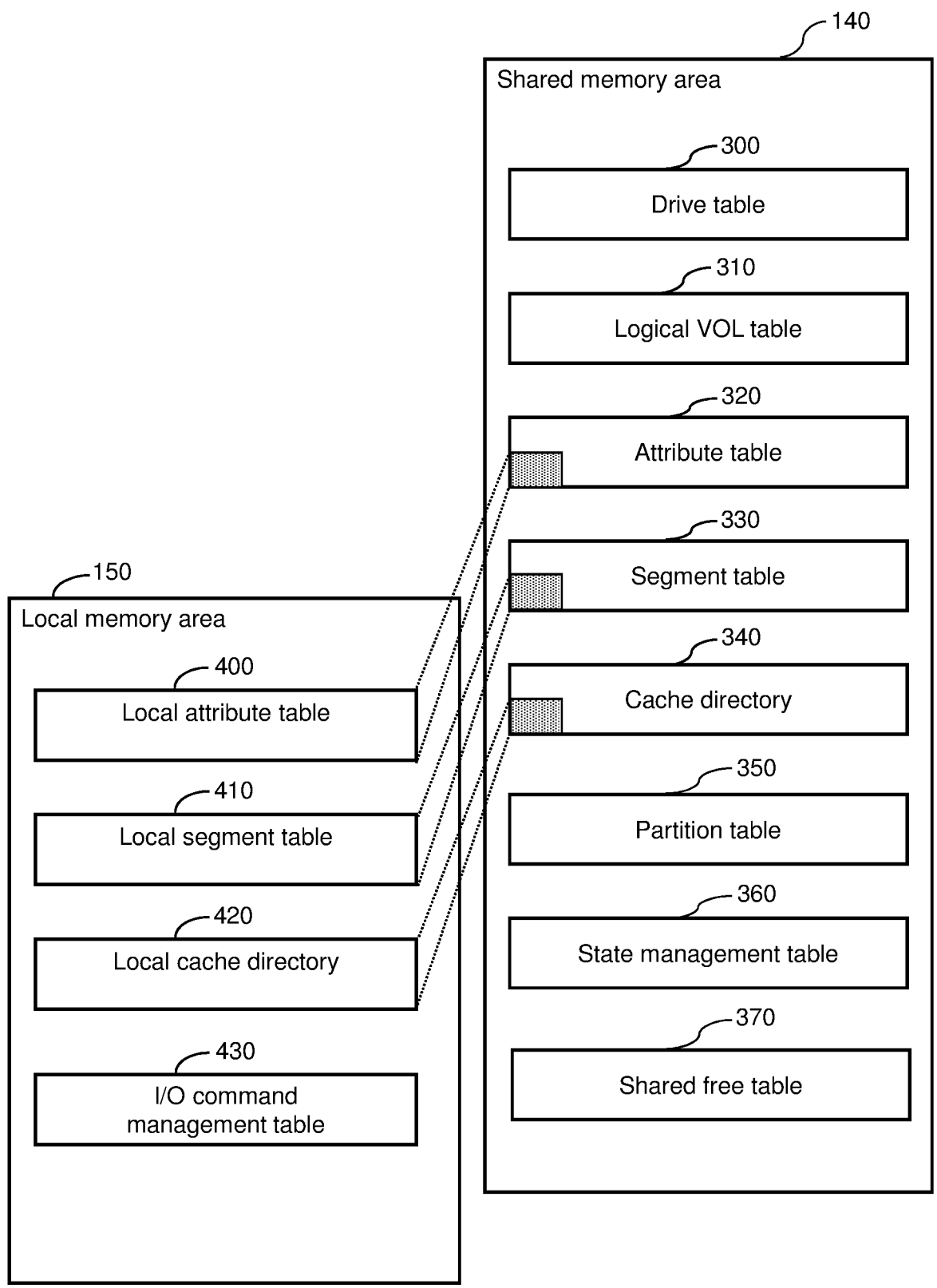
FIG. 5 shows an example of information stored in a shared memory area and a local memory area.

FIG. 5 shows an example of information stored in the shared memory area 140 and the local memory area 150.

The shared memory area 140 may include a drive table 300, a logical VOL table 310, an attribute table 320, a segment table 330, a cache directory 340, a partition table 350, a state management table 360, and a shared free table 370.

The drive table 300 includes information related to each drive 18. Details of the drive table 300 will be provided later (refer to FIG. 6).

The logical VOL table 310 includes information related to each logical VOL. Details of the logical VOL table 310 will be provided later (refer to FIG. 7).

The attribute table 320 includes information related to attributes of a segment. Details of the attribute table 320 will be provided later (refer to FIG. 10).

The segment table 330 includes information related to each segment. Details of the segment table 330 will be provided later (refer to FIG. 8).

The cache directory 340 includes information related to a cache. Details of the cache directory 340 will be provided later (refer to FIG. 11).

The partition table 350 includes information related to a size of each partition. Details of the partition table 350 will be provided later (refer to FIG. 12).

The state management table 360 includes information related to an operational status of each processor 12. Details of the state management table 360 will be provided later (refer to FIG. 13).

The shared free table 370 includes information related to a shared free segment. Details of the shared free table 370 will be provided later (refer to FIG. 14).

The local memory area 150 may include a local attribute table 400, a local segment table 410, a local cache directory 420, and an I/O command management table 430.

The local attribute table 400 includes at least a part of the information in the attribute table 320 of the shared memory area 140.

The local segment table 410 includes at least a part of the information in the segment table 330 of the shared memory area 140.

The local cache directory 420 includes at least a part of the information in the cache directory 340 of the shared memory area 140.

Before accessing the pieces of information 320, 330, and 340 stored in the shared memory area 140, the processors 12a-12d may access the pieces of information 400, 410, and 420 stored in the local memory area 150 in the same controller 11a or 11b. This is to avoid a conflict which may occur when a plurality of processors 12a-12d access the shared memory area 140. Moreover, in the present embodiment, an access to the tables 320, 330, and 340 in the shared memory area 140 may constitute an access to the tables 400, 410, and 420 in the local memory area 150 or vice versa.

FIG. 6 shows a configuration example of the drive table 300.

The drive table 300 is a table for managing the drives 18 included in the storage system 2a. As field values, a record of the drive table 300 may include a drive number 301, a parity group number 302, a RAID level 303, a drive capacity 304, and a drive type 305.

The drive number 301 is a number for identifying the drive 18.

The parity group number 302 is a number for identifying a parity group. Drives with drive numbers 301 in which the parity group number 302 is the same may form a parity group represented by the parity group number 302.

The RAID level 303 represents a RAID level of a parity group represented by the parity group number 302. Examples of the RAID level 303 include RAID 1 (2D2D) and RAID 5 (3D1P).

The drive capacity 304 represents a maximum capacity of one of the drives 18 with the drive number 301. Examples of a unit of the drive capacity 304 include GB (Giga Byte) and TB (Tera Byte).

The drive type 305 represents a type of one of the drives 18 with the drive number 301. Examples of the drive type 305 include an SSD, an SAS (Serial Attached SCSI), and an NL-SAS (Near-onLine SAS).

By referring to the drive table 300, the drive number 301 and an access destination (address) in one of the drives 18 with the drive number 301 which correspond to an access destination (address) to a parity group can be identified.

Figure 7:
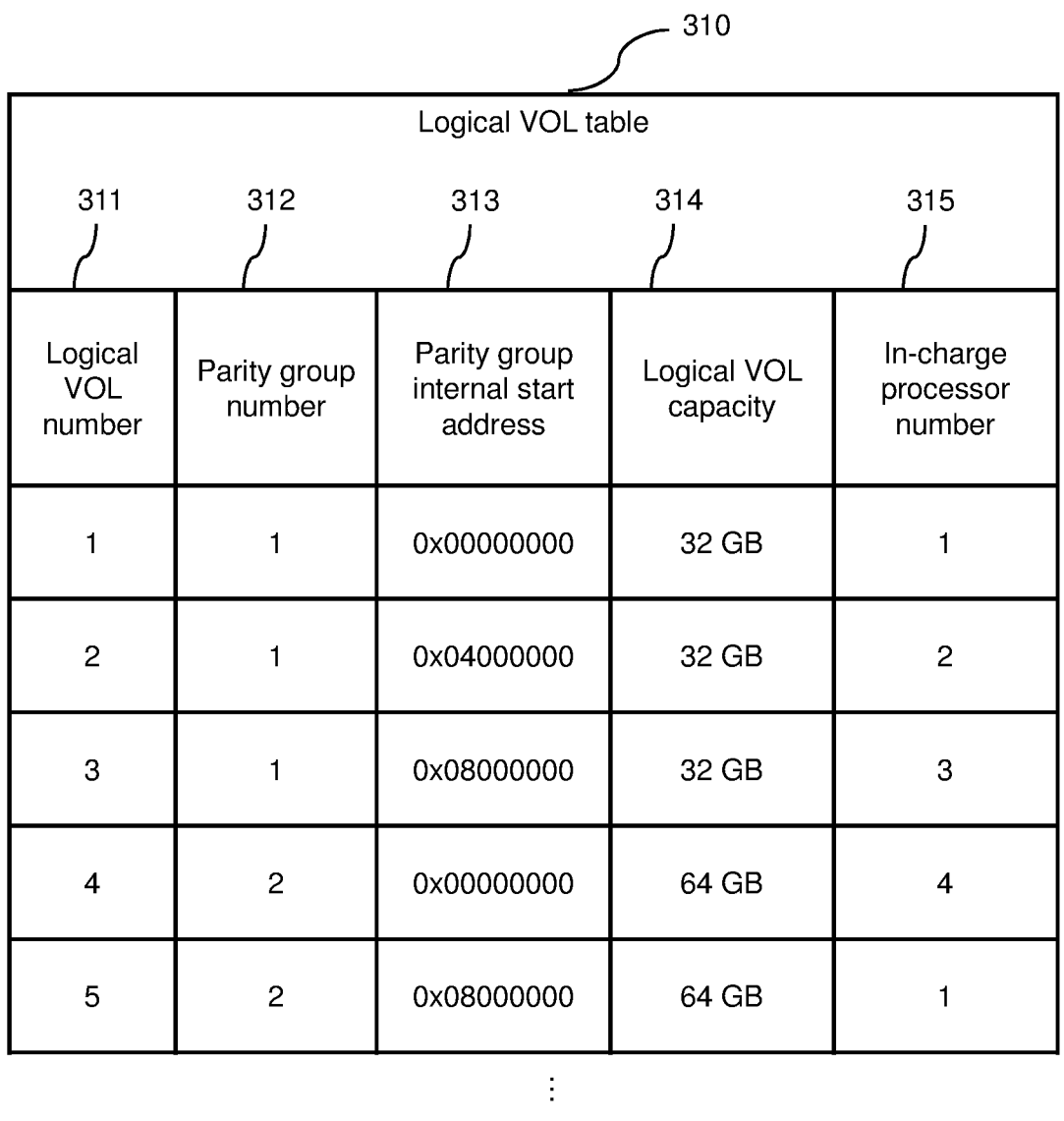
FIG. 7 shows a configuration example of a logical VOL (Volume) table.

FIG. 7 shows a configuration example of the logical VOL table 310.

The logical VOL table 310 is a table for managing logical VOLs included in the storage system 2. As field values, a record in the logical VOL table 310 includes a logical VOL number 311, a parity group number 312, a parity group internal start address 313, a logical VOL capacity 314, and an in-charge processor number 315.

The logical VOL number 310 is a number for identifying a logical VOL.

The parity group number 312 represents a number of a parity group to which a logical VOL with the logical VOL number 311 belongs.

The parity group internal start address 313 represents a start address of a logical VOL with the logical VOL number 311 in a parity group with the parity group number 312.

The logical VOL capacity 314 represents a maximum capacity of a logical VOL with the logical VOL number 311. An example of a unit of the logical VOL capacity 314 is GB.

The in-charge processor number 315 represents the number of the processors 12a-12d in charge of an I/O process of a logical VOL with the logical VOL number 311.

By referring to the logical VOL table 310, the parity group number 312 and an access destination (address) in a parity group with the parity group number 312 which correspond to an access destination (address) to a logical VOL can be identified.

Therefore, by referring to the drive table 300 and the logical VOL table 310, the drive number 301 and an access destination (address) in the drive number 301 which correspond to an access destination (address) of a logical VOL can be identified.

In the present embodiment, a case where a logical VOL belongs to a single parity group will be described. However, the logical VOL may be a logical VOL related to thin provisioning. In other words, a configuration may be adopted which includes a pool constituted by a plurality of parity groups, whereby when accessing a logical VOL (a virtual VOL), a partial area of the pool is dynamically allocated to the logical VOL (the virtual VOL).

FIG. 8 shows a configuration example of the segment table 330.

The segment table 330 is a table for managing segments included in the storage system 2a. As field values, a record in the segment table 330 includes a segment number 331, a logical VOL number 332, a block number 333, a node number 334, a forward node number 335, a reverse node number 336, a segment attribute 337, a dirty bit map 338, and a controller number 339.

The segment number 331 is a number for identifying a segment in the cache memory area 170.

The logical VOL number 332 is similar to the logical VOL number 310 described earlier.

The block number 333 is a number for identifying each of a plurality of blocks constituting a logical VOL with the logical VOL number 332. Blocks and segments may have a one-to-one correspondence. For example, cache data stored in a segment with the segment number 331 may be the same as data stored in a block with the block number 333 in a logical VOL with the logical VOL number 332.

The node number 334 is a number for identifying a record of the segment table 300.

The forward node number 335 represents the number of a next node from the node number 334 toward LRU (Least Recently Used) in a connection queue for each attribute. When the node number 334 represents an end in an LRU direction of the connection queue, the forward node number 335 may be expressed as "LRU".

The reverse node number 336 represents the number of a next node from the node number 334 toward MRU (Most Recently Used) in the connection queue for each attribute. When the node number 334 represents an end in an MRU direction of the connection queue, the reverse node number 336 may be expressed as "MRU".

The segment attribute 337 represents an attribute of a segment with the segment number 331. Examples of the segment attribute 337 include "clean", "dirty", "free", and "shared free".

A segment with the segment number 331 in a record with a "clean" segment attribute 337 is a segment which is already allocated to the partition 172a-1a to 172-2d for a certain processor 12a-12d and which stores cache data already stored in one of the drives 18. This segment may be referred to as a "clean segment" and the cache data stored in the clean segment may be referred to as "clean data".

A segment with the segment number 331 in a record with a "dirty" segment attribute 337 is a segment which is already allocated to the partition 172a-1a to 172-2d for a certain processor 12a-12d and which stores cache data not stored in one of the drives 18. This segment may be referred to as a "dirty segment" and the cache data stored in the dirty segment may be referred to as "dirty data".

A segment with the segment number 331 in a record with a "clean" segment attribute 337 is a (free) segment which is already allocated to the partition 172a-1a to 172-2d for a certain processor 12a-12d and which does not store cache data. This segment may be referred to as a "free segment". A free segment is capable of newly storing cache data. When cache data is newly stored in a free segment, the segment may be changed to a dirty segment or a clean segment.

A segment with the segment number 331 in a record with a "shared free" segment attribute 337 is a segment which is not allocated to the partition 172a-1a to 172-2d for any of the processors 12a-12d. This segment may be referred to as a "shared free segment". A shared free segment may be allocated to the partition 172a-1a to 172-2d for a certain processor 12a-12d. When a shared free segment is allocated to the partition 172a-1a to 172-2d for a certain processor 12a-12d, the segment may be changed to a free segment.

The dirty bit map 338 indicates which portion of a dirty segment with the segment number 331 has data that is not stored in the drive 18. By using the dirty bit map 338, when receiving write data with a smaller size than a size of a segment from the host computers 4, the controllers 11a and 11b need only store the portion in which the write data is not stored in the drives 18.

The controller number 339 represents the number of the controller 11a and 11b including the memories 13a and 13b having a segment with the segment number 331.

Figure 9:
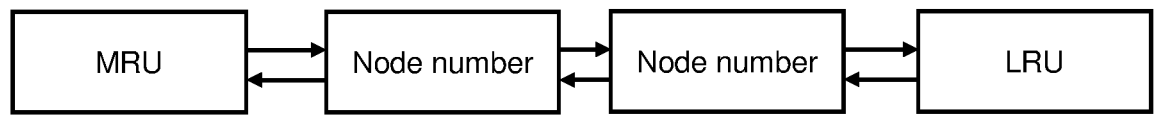
FIG. 9 shows a configuration example of a connection queue.

FIG. 9 shows a configuration example of a connection queue.

The controllers 11a and 11b may manage, in the cache memory area 170 of the memories 13a and 13b included in the controllers 11a and 11b themselves, connection queues related to a clean segment, a dirty segment, and a free segment for each partition 172a-1a to 172-2d. The controllers 11a and 11b may manage, in the cache memory areas 170-1 and 170-2 of the memories 13a and 13b included in the controller 11a and 11b themselves, a connection queue related to a shared clean segment.

The connection queue may be a bi-directional connection queue with the node number 334 corresponding to a most recently used segment at a head thereof and the node number 334 of a least recently used segment at a tail end thereof. Moreover, the connection queue of a free segment need not manage an LRU. This is because an LRU need not be managed since a free segment is changed to a clean segment or a dirty segment when accessed. In addition, the connection queue of a shared free segment also need not manage an LRU. This is because no LRU management is required since there is no direct access to a shared free segment.

FIG. 10 shows a configuration example of the attribute table 320.

The attribute table 320 is a table for managing a connection queue of each attribute for each partition. As field values, a record in the attribute table 320 may include a processor number 321, a controller number 322, a segment attribute 323, an MRU node number 324, and an LRU node number 325.

The processor number 321 is a number for identifying the processor 12a-12d.

The controller number 322 is a number for identifying the controller 11a or 11b.

The segment attribute 323 is similar to the segment attribute 337 described earlier.

The MRU node number 324 represents the node number 334 of an MRU of a connection queue with the segment attribute 323 in the partition 172a-1a to 172-2d for the processor 12a-12d with the processor number 321 configured in the cache memory area 170-1 or 170-2 of the memory 13a or 13b in the controller 11a or 11b with the controller number 322.

The LRU node number 325 represents the node number 334 of an LRU of a connection queue with the segment attribute 323 in the partition 172a-1a to 172-2d for the processors 12a-12d with the processor number 321 configured in the cache memory area 170-1 and 170-2 of the memory 13a or 13b in the controller 11a or 11b with the controller number 322.

For example, in FIG. 10, when desiring to search clean segments in an order of most recent use in the partition 172a-1a to 172-2d for the processors 12a-12d with the processor number 321 of "1" configured in the cache memory area 170-1 or 170-2 of the memory 13a or 13b in the controller 11a or 11b with the controller number 322 of "1", the forward node numbers 335 in the segment table 330 may be sequentially traced starting at the MRU node number 324 of "2". Conversely, when desiring to search clean segments in an order of least recent use, the reverse node numbers 336 in the segment table 330 may be sequentially traced starting at the LRU node number 325 of "121". A similar description applies to a dirty segment and a free segment.

Moreover, the processor number 321 in a record with the segment attribute 323 of "shared free" may be "NULL". This is because a shared free segment need not be managed for each processor 12a-12d.

FIG. 11 shows a configuration example of the cache directory 340.

The cache directory 340 is a table for managing data that has already been cached. As field values, a record in the cache directory 340 may include a logical VOL number 341, a block number 342, a first node number 343, and a second node number 344.

The logical VOL number 341 and the block number 342 are similar to the logical VOL number 332 and the block number 333 described earlier.

The first node number 343 and the second node number 344 correspond to the node number 334 described earlier.

For example, the cache directory 340 in FIG. 11 shows that data of a block with the block number 342 of "3" in a logical VOL with the logical VOL number 340 of "1" is cached in a segment with the segment number 331 corresponding to the first node number 343 of "20" and a segment with the segment number 331 corresponding to the second node number 344 of "15".

One of the main reasons for caching the same data in two segments is to secure redundancy of write data. Therefore, the segment corresponding to the first node number 343 and the segment corresponding to the second node number 344 desirably belong to memories 13a and 13b of different controllers 11a and 11b.

By referring to the cache directory 340, a determination of a cache hit or a cache miss can be made. A cache hit can be determined when any of the first node number 343 and the second node number 344 corresponding to the block number 342 with the logical VOL number 341 of an access destination is not "NULL". A cache miss can be determined when both of the first node number 343 and the second node number 344 corresponding to the block number 342 with the logical VOL number 341 of the access destination are "NULL".

Figure 12:
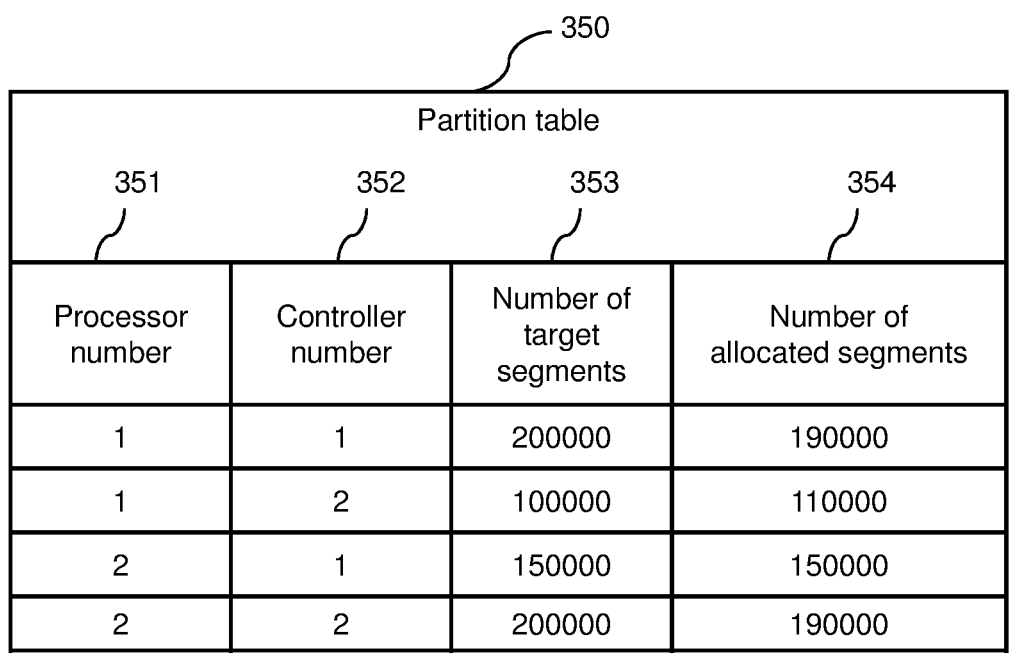
FIG. 12 shows a configuration example of a partition table.

FIG. 12 shows a configuration example of the partition table 350.

The partition table 350 is a table for managing the partition 172a-1a to 172-2d for each processor 12a-12d in the cache memory area 170-1 and 170-2. As field values, a record in the partition table 350 may include a processor number 351, a controller number 352, a number of target segments 353, and a number of allocated segments 354.

The processor number 351 and the controller number 352 are similar to the processor number 321 and the controller number 322 described earlier.

The number of allocated segments 354 represents the number of segments allocated to the partition 172a-1a to 172-2d for the processors 12a-12d with the processor number 352 in the cache memory area 170-1 or 170-2 of the memories 13a or 13b in the controllers 11a or 11b with the controller number 352.

The number of target segments 353 represents the number of segments that are desirably allocated to the partitions 172a-1a to 172-2d for the processors 12a-12d with the processor number 352 in the cache memory areas 170-1 or 170-2 of the memories 13a or 13b in the controllers 11a or 11b with the controller number 352. In other words, a difference between the number of allocated segments 354 and the number of target segments 353 is desirably as small as possible. The number of target segments 353 may be changed as appropriate in accordance with the state of the storage system 2a.

Figure 13:
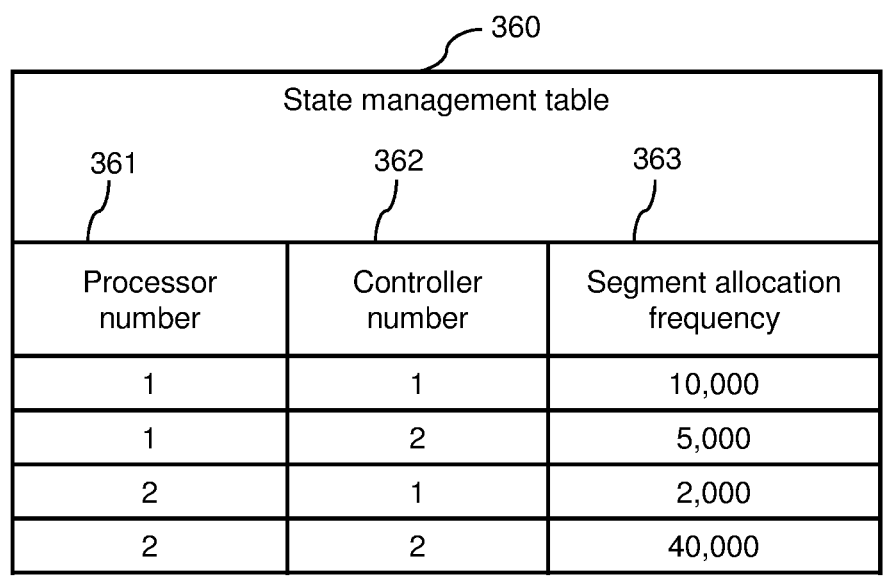
FIG. 13 shows a configuration example of a state management table.

FIG. 13 shows a configuration example of the state management table 360.

The state management table 360 includes information related to an operational status of the storage system 2a. Information in the state management table 360 may be used to determine the number of target segments 353. As field values, a record in the state management table 360 may include a processor number 361, a controller number 362, and a segment allocation frequency 363.

The processor number 361 and the controller number 362 are similar to the processor number 321 and the controller number 322 described earlier.

The segment allocation frequency 363 represents the number of segments newly allocated, per unit time, to the partition 172 for the processors 12a-12d with the processor number 361 in the cache memory areas 170-1 or 170-2 of the memory 13a or 13b in the controller 11a or 11b with the controller number 362. Moreover, the segment allocation frequency 363 according to the present embodiment is merely an example and any indicator may be used as long as the indicator enables the number of target segments 353 to be determined. For example, a stay time of a clean segment in a connection queue, a cache hit rate, or the number of segments newly allocated per unit I/O may be adopted. Alternatively, the manager may be able to input an indicator for determining the number of target segments 353 through the management computers 30.

FIG. 14 shows a configuration example of the shared free table 370.

The shared free table 370 is a table for managing a shared free segment. As field values, a record in the shared free table 370 may include a controller number 371, a number of shared free segments 372, and a shared free segment threshold 373.

The controller number 371 is similar to the controller number 322 described earlier.

The number of shared free segments 372 represents the number of shared free segments existing in the memory 13 in the controller 11a or 11b with the controller number 371.

The shared free segment threshold 373 represents a lower limit threshold with respect to the number of shared free segments 372. When the number of shared free segments 372 is depleted, the number of allocated segments 354 with respect to the partitions 172a-1a to 172-2d can no longer be adjusted in the memory 13 in the controllers 11a or 11b with the controller number 371. In consideration thereof, the controllers 11a or 11b may adjust the number of shared free segments 372 so as not to fall to or below the shared free segment threshold 373.

FIG. 15 shows a configuration example of the I/O command management table 430.

The I/O command management table 430 is a table for managing I/O commands received by the controllers 11a or 11b. As field values, a record in the I/O command management table 430 may include an I/O command management number 431, an I/O in-process flag 432, an I/O command-receiving controller number 433, and an I/O command type 434.

The I/O command management number 431 is a number for identifying an I/O command in the storage system 2a.

The I/O in-process flag 432 is a flag indicating that an I/O command with the I/O command management number 431 is either not processed or is being processed. For example, the I/O in-process flag 432 may be turned "OFF" when the I/O command is not processed and turned "ON" when the I/O command is being processed.

The I/O command-receiving controller number 433 represents the number of the controllers 11a or 11b having received the I/O command with the I/O command management number 431.

The I/O command type 434 represents a type of the I/O command with the I/O command management number 431. Examples of the I/O command type 434 include a read command and a write command.

Figure 16:
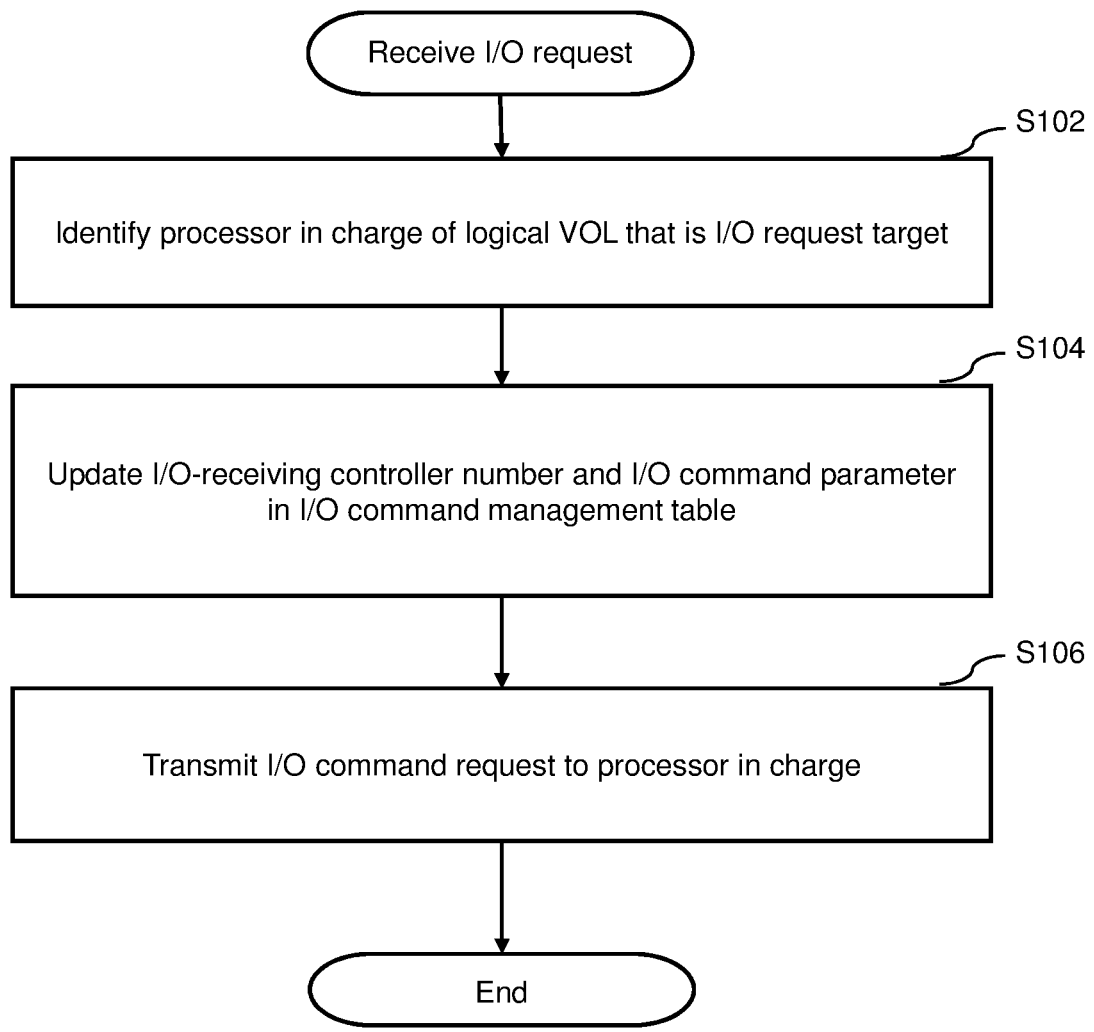
FIG. 16 is a flow chart showing a processing example of an I/O command distribution program.

FIG. 16 is a flow chart showing a processing example of the I/O command distribution program 200.

The program 200 may be executed by any of the processors 12 of the controller 11a or 11b having received an I/O request. When the program 200 detects that an I/O request has been received from one of the host computers 4, the program 200 executes the following process.

The program 200 identifies the in-charge processor number 315 corresponding to the logical VOL number 311 of an access destination from the logical VOL table 310 (step S102). In the following description, the processors 12a-12d with the identified in-charge processor number 315 will be referred to as a "processor in charge".

The program 200 acquires an unused I/O command management number 431 from the I/O command management table 430 in the local memory area 150 of the processor in charge. In addition, the program 200 changes the I/O in-process flag 432 corresponding to the acquired I/O command management number 431 to "ON". Furthermore, the program 200 updates the I/O-receiving controller number 433 and the I/O command parameter 434 (step S104).

The program 200 transmits an I/O command processing request including the I/O command management number 431 acquired in step S104 to the processor in charge (step S106). Subsequently, the program 200 ends the present process.

Figure 17:
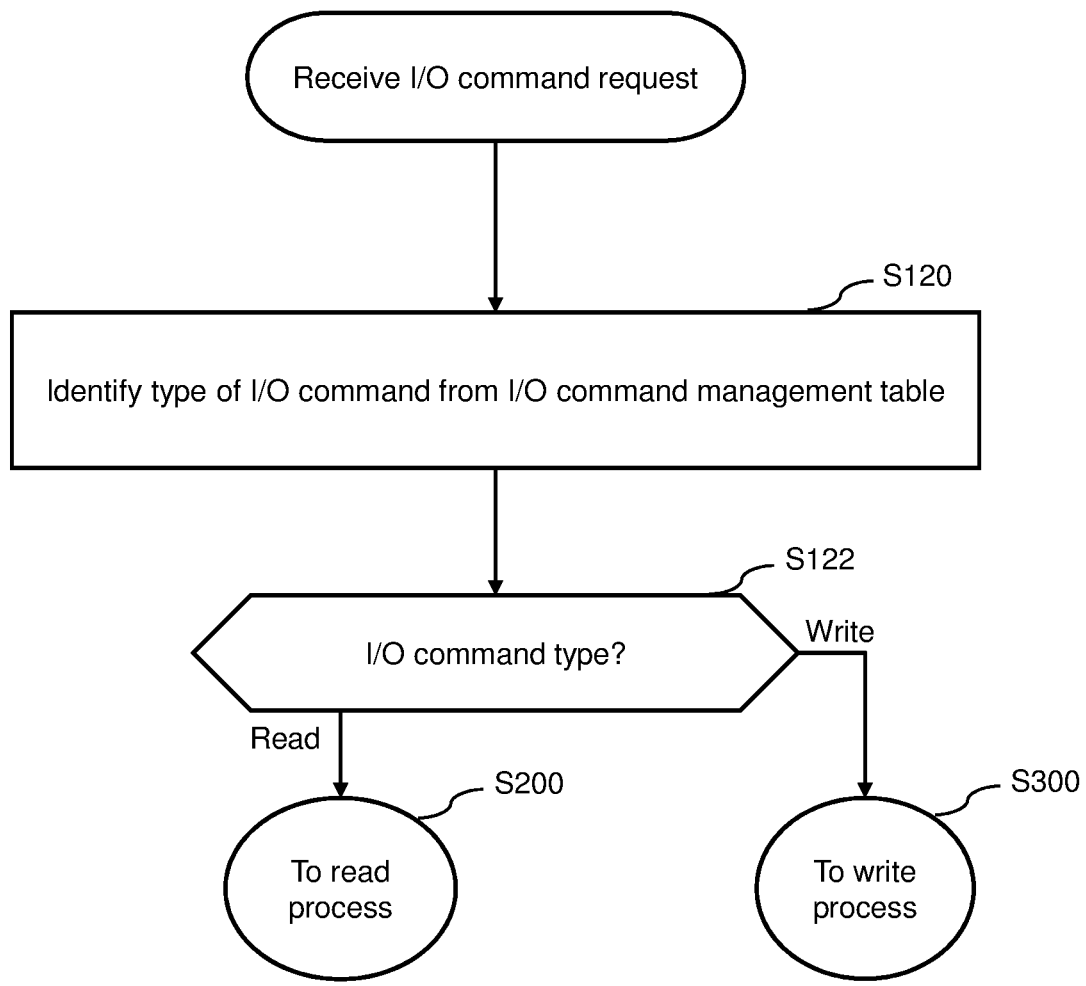
FIG. 17 is a flow chart showing a processing example of an I/O processing program.

FIG. 17 is a flow chart showing a processing example of the I/O processing program 202.

The program 202 may be executed by a processor in charge. When the program 202 detects that an I/O command processing request has been received, the program 200 executes the following process.

The program 202 extracts the I/O command management number 431 from the received I/O command processing request, and identifies the I/O command type 434 corresponding to the extracted I/O command management number 431 from the I/O command management table 430 (step S120).

Based on the identified I/O command type 434, the program 202 determines whether the I/O command is a read command or a write command (step S122).

When the determination result of step S122 is a "read command" (step S122: read), the program 202 performs a read process (step S200). Details of the read process are shown in FIG. 18.

Figure 19:
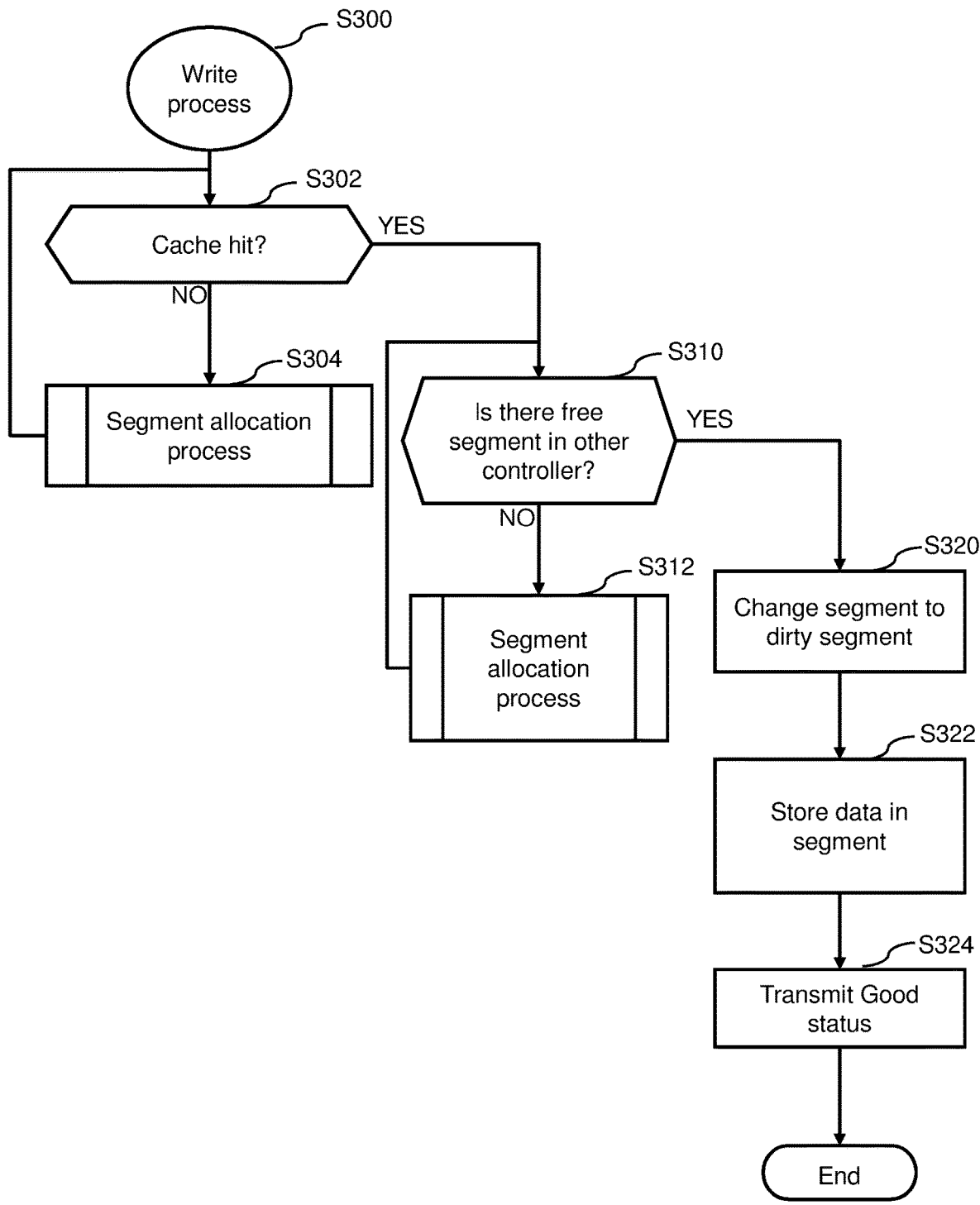
FIG. 19 is a flow chart showing an example of a write process.

When the determination result of step S122 is a "write command" (step S122: write), the program 202 performs a write process (step S300). Details of the write process are shown in FIG. 19.

Figure 18:
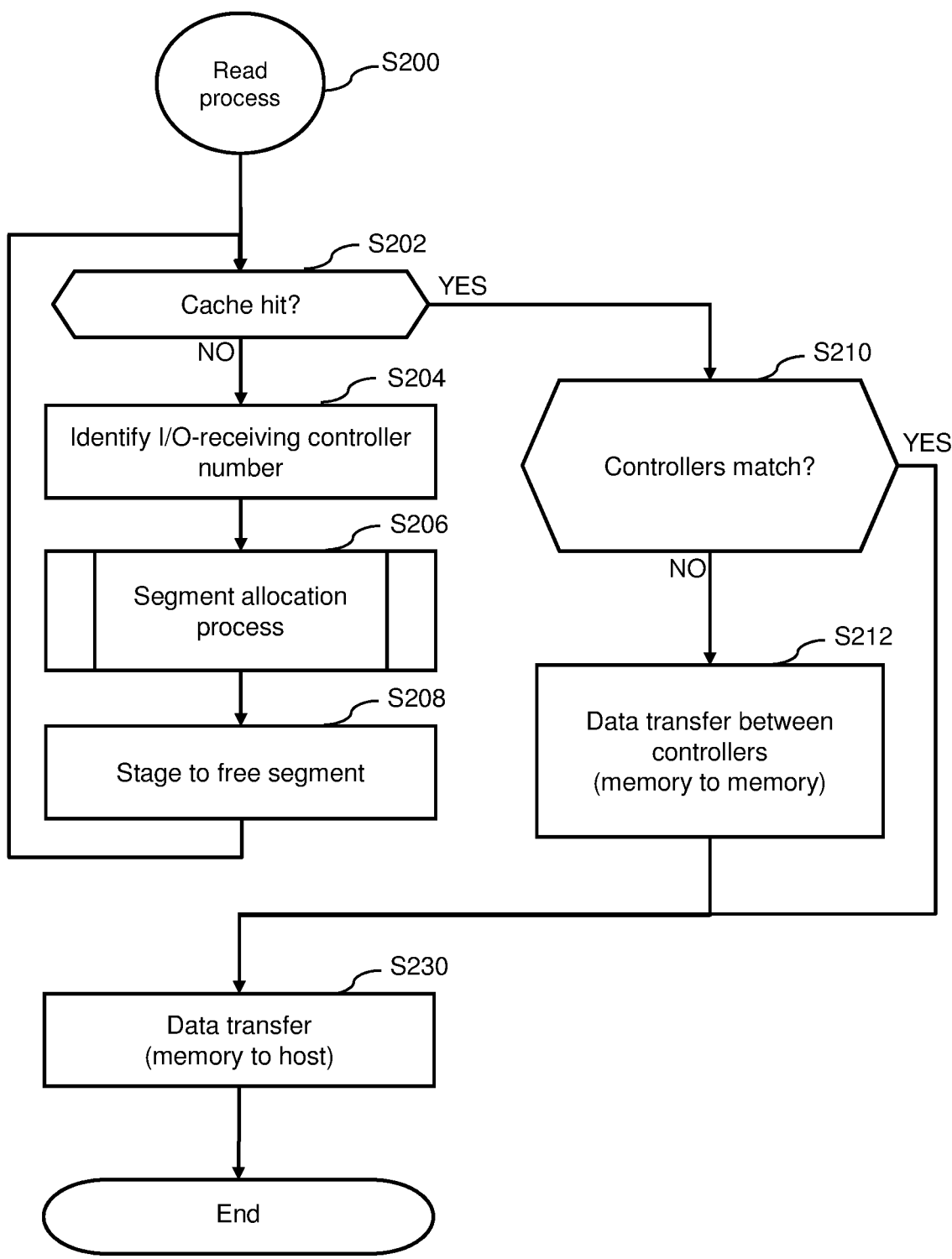
FIG. 18 is a flow chart showing an example of a read process.

FIG. 18 is a flow chart showing an example of the read process.

The I/O processing program 202 refers to the cache directory 340 (or the local cache directory 420) and determines whether or not both the first node number 343 and the second node number 344 corresponding to the block number 342 of the logical VOL number 341 of a read destination are "NULL" (step S202). In other words, the program 202 determines whether data of a block of a logical VOL that is the read destination is a cache hit or a cache miss.

In the case of a cache miss (step S202: NO), the program 202 performs the following process.

The program 202 identifies the I/O-receiving controller number 433 corresponding to the I/O command management number 431 extracted in step S120 from the I/O command management table 430 (step S204).

Subsequently, the segment management program 206 performs a segment allocation process with respect to the partition 172a-1a to 172-2d of the memory 13a or 13b of the controller 11a or 11b with the identified I/O-receiving controller number 433 (step S206). Details of the segment allocation process will be provided later (refer to FIG. 20).

Subsequently, the RAID processing program 204 stages data of a block of the logical VOL that is the read destination to a free segment allocated to the partition 172a-1a to 172-2d by the segment allocation process (step S208). The program 202 then returns to step S202.

In the case of a cache hit (step S202: YES), the program 202 performs the following process.

The program 202 extracts a record including a hit node number 334 between the first node number 343 and the second node number 344 from the segment management table 330. In addition, the program 202 identifies the controller number 339 from the extracted record. Furthermore, the program 202 determines whether or not the identified controller number 339 and the I/O-receiving controller number 433 corresponding to the I/O command management number 431 extracted in step S120 match each other (step S210).

When the determination result of step S210 is positive (step S210: YES), the program 202 advances to step S230.

When the determination result of step S210 is negative (step S210: NO), the inter-controller transfer program 216 transfers data of the cache hit segment to the buffer area 160 of the memory 13a or 13b of the controller 11a or 11b having received the read request from one of the host computers 4 (step S212). Subsequently, the program 202 advances to step S230.

In step S230, the program 202 returns data in the cache area 170 or the buffer area 160 of the memory 13a or 13b of the controller 11a or 11b having received the read request from one of the host computers 4 to the one of the host computers 4 as a response to the read request (step S230). Subsequently, the program 202 ends the present process.

The data transfer between controllers 11a and 11b in step S212 may constitute an overhead with respect to a bandwidth of the memories 13a and 13b, a bandwidth of the inter-controller path 32, and processes by the processors 12a-12d. In consideration thereof, the program 202 preferentially stores cache data corresponding to read data in the memory 13a or 13b of the controller 11a or 11b having received the I/O request from one of the host computers 4. In other words, in step S206, a new segment is allocated to a partition of the memory 13a or 13b of the controller 11a or 11b having received the I/O request from one of the host computers 4. Accordingly, occurrences of data transfer between the controllers 11a and 11b can be reduced.

FIG. 19 is a flow chart showing an example of the write process.

In a similar manner to step S202 described earlier, the I/O processing program 202 determines whether data of a block of a logical VOL that is a write destination is a cache hit or a cache miss (step S302).

In the case of a cache miss (step S302: NO), the segment management program 206 performs the segment allocation process (step S304). Details of the segment allocation process will be provided later (refer to FIG. 20). Subsequently, the program 202 returns to step S302. After the return, a determination of "YES" is made in step S302.

In the case of a cache hit (step S302: YES), the program 202 determines whether or not a free segment for storing write data exists in one of the partitions 172*a*-1*a* to 172-2*d* of the memory 13*a* or 13*b* of another controller 11*a* or 11*b* (step S310).

When the determination result of step S310 is negative (step S310: NO), the segment management program 206 performs the segment allocation process with respect to one of the partitions 172*a*-1*a* to 172-2*d* of the memory 13*a* or 13*b* of the other controller 11*a* or 11*b* (step S312). Subsequently, the program 202 returns to step S310. After the return, a determination of "YES" is made in step S310.

When the determination result of step S310 is positive (step S310: YES), the RAID processing program 204 changes the dirty bit map 338 of the free segment for storing cache data corresponding to the write data so that the dirty bit map 338 conforms to a block of a logical VOL that is the write destination. In addition, the program 202 changes the segment attribute 337 of the free segment to "dirty". In other words, the program 202 changes the free segment to a dirty segment.

The program 202 stores the write data received from one of the host computers 4 in the two segments allocated in step S304 and step S312 (step S322). In other words, the program 202 stores (duplexes) the cache data corresponding to the write data in the respective memories 13*a* and 13*b* of the two controllers 11*a* and 11*b*. Moreover, the dirty data stored in the segment may be destaged to the drives 18 asynchronously with the I/O process by the RAID program 204.

The program 202 returns a "Good status" to one of the host computers 4 as a response to the write request from the one of the host computers 4 (step S324). Subsequently, the program 202 ends the present process.

Figure 20:
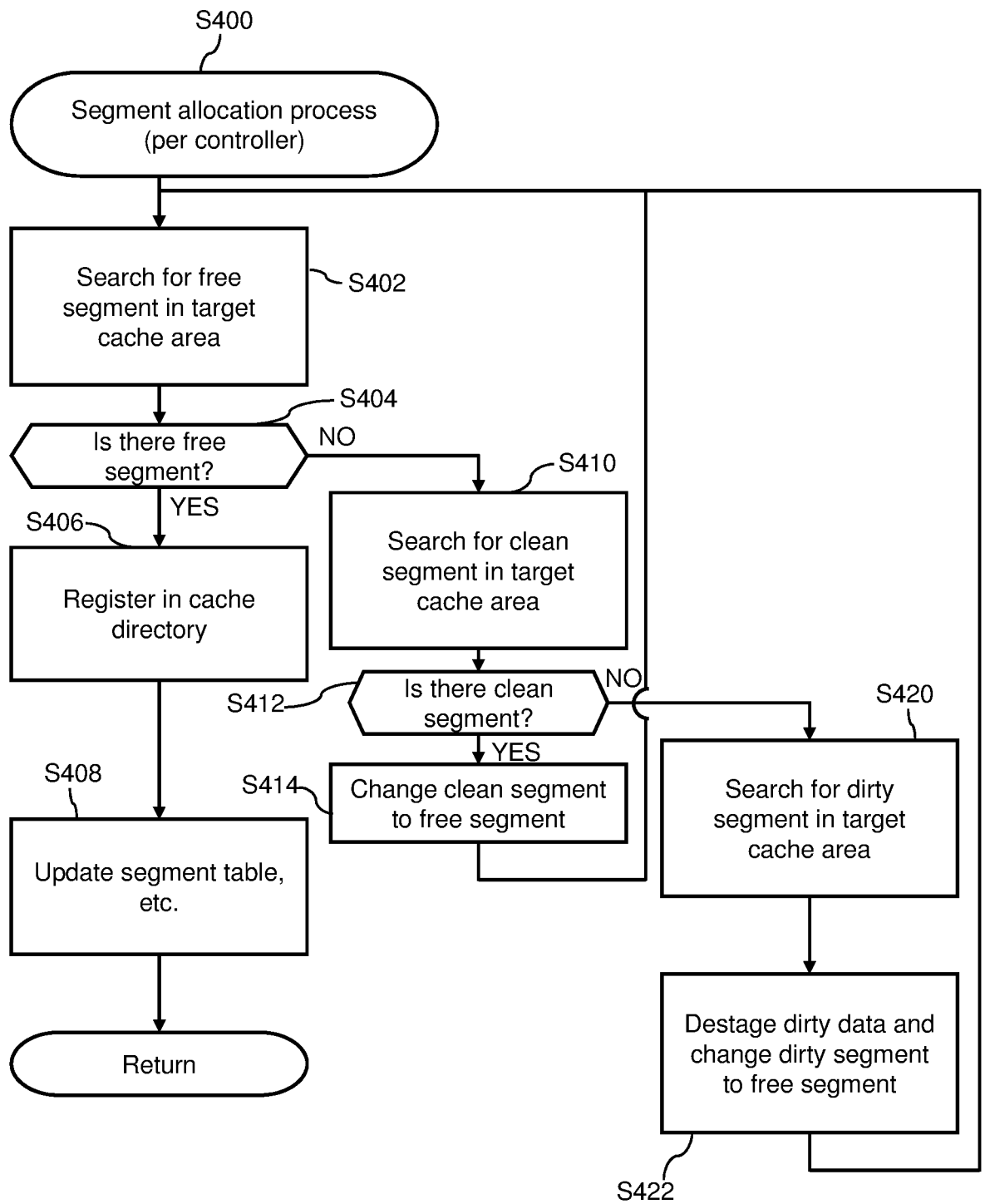
FIG. 20 is a flow chart showing a processing example of a segment management program.

FIG. 20 is a flow chart showing a processing example of the segment management program 206.

The present process corresponds to details of step S206 in FIG. 18 and steps S304 and S312 in FIG. 19. The present process may be executed for each controller 11*a* and 11*b* (step S400).

The segment management program 206 extracts a group of records including the processor number 321 executing the program 206 and the controller number 322 matching the I/O-receiving controller number 433 identified in step S204 from the attribute table 320. In addition, the program 206 identifies the LRU node number 325 of a record of which the segment attribute 323 is "free" from the extracted group of records. Furthermore, the program 206 searches for a node number with a free attribute from a free queue having the identified LRU node number 325 as an LRU (step S402). In other words, the program 206 searches for a free segment.

When a node number with a free attribute is discovered in step S402 (step S404: YES), the program 206 performs the following process.

The program 206 registers the discovered node number with a free attribute in the first node number 343 (or the second node number 344) in the cache directory 340 (step S406).

Subsequently, the program 206 separates (dequeues) the discovered node number with a free attribute from the free queue and connects (enqueues) the node number to an MRU of a clean queue. In other words, the free segment is changed to a clean segment. In addition, the program 206 updates the logical VOL number 332, the block number 333, the dirty bit map 338, and the controller number 339 of a record including the node number 334 in the segment table 330 (step S408).

Furthermore, the program 206 updates (increments) the segment allocation frequency 363 in the state management table 360. Subsequently, a return is made to a process that is a call source of the present process.

When a node number with a free attribute is not discovered in step S402 (step S404: NO), the program 206 performs the following process.

The program 206 identifies the LRU node number 325 of a record of which the segment attribute 323 is "clean" from the group of records extracted in step S402. In addition, the program 206 searches for a node number with a clean attribute from a clean queue having the identified LRU node number 325 as an LRU (step S410). In other words, the program 206 searches for a clean segment.

When a node number with a clean attribute is discovered in step S410 (step S412: YES), the program 206 performs the following process.

The program 206 separates (dequeues) the discovered node number with a clean attribute from the clean queue and connects (enqueues) the node number to an MRU of a free queue. In other words, the program 206 changes the clean segment to a free segment. Subsequently, the program 206 changes the segment attribute 337 of a record including the node number 334 in the segment table 330 to "free". In addition, the program 206 changes the first node number 343 and the second node number 344 including the discovered node number in the cache directory 340 to "NULL" (step S414). Subsequently, the program 206 returns to step S402. Accordingly, a free segment is reserved in one of the partitions 172*a*-1*a* to 172-2*d*.

When a node number with a clean attribute is not discovered in step S410 (step S412: NO), the program 206 performs the following process.

The program 206 identifies the LRU node number 325 of a record of which the segment attribute 323 is "dirty" from the group of records extracted in step S402. In addition, the program 206 searches for a node number with a dirty attribute from a dirty queue having the identified LRU node number 325 as an LRU (step S420). In other words, the program 206 searches for a dirty segment. Since this process is executed when neither a free segment nor a clean segment is found, a dirty segment is to be discovered.

Subsequently, the RAID processing program 204 destages data of the discovered dirty segment to a logical VOL. In addition, the program 206 separates (dequeues) the node number with a dirty attribute from the dirty queue and connects (enqueues) the node number to an MRU of a free queue. In other words, the program 206 changes the dirty segment to a free segment (step S422). Subsequently, the program 206 returns to step S402. Accordingly, a free segment is reserved in one of the partitions 172*a*-1*a* to 172-2*d*.

Figure 21:
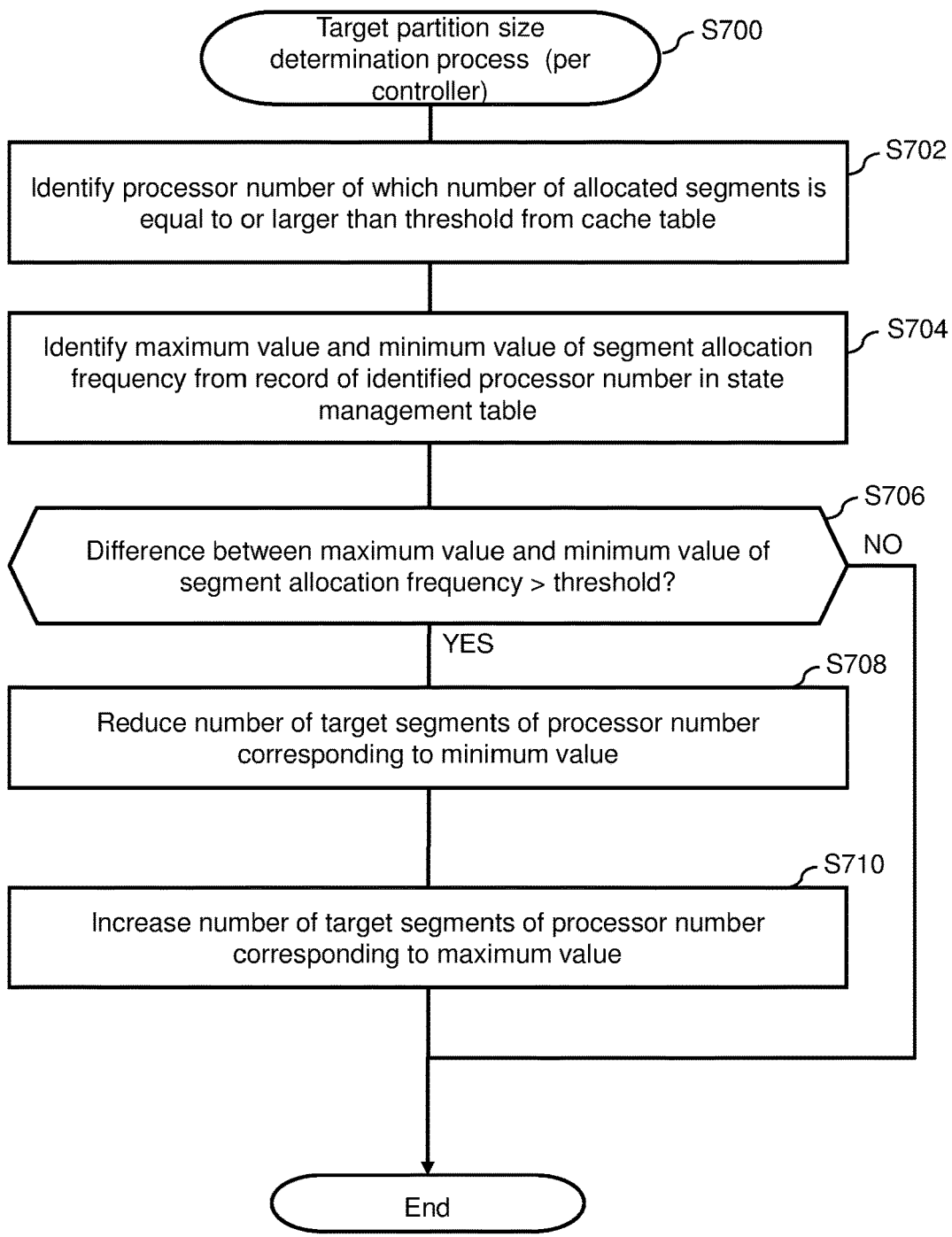
FIG. 21 is a flow chart showing a processing example of a target partition determination program.

FIG. 21 is a flow chart showing a processing example of the target partition determination program 212 executing a target partition size determination process (step S700).

The present process may be executed at prescribed intervals or may be executed in response to an instruction from the management computers 30. The present process may be executed asynchronously with I/O processes in order to avoid affecting the I/O processes.

The target partition determination program 212 identifies the processor number 351 which includes the controller number 352 that is a processing target and of which the number of allocated segments 354 is equal to or larger than a prescribed threshold from the partition table 350. This is to prevent the number of allocated segments from being further reduced from partitions 172a-1a to 172-2d with a small number of allocated segments 354 (step S702).

Next, the program 212 extracts a group of records including the controller number 352 that is the processing target and the processor number 351 identified in step S702 from the state management table 360. In addition, the program 212 identifies a record of which the segment allocation frequency 363 is a maximum value and a record of which the segment allocation frequency 363 is a minimum value from the extracted group of records (step S704).

Subsequently, the program 212 determines whether or not a difference between the maximum value and the minimum value of the segment allocation frequency 363 identified in step S704 is larger than a prescribed threshold (step S706). This is to prevent the number of target segments 353 from being frequently changed due to an error, a temporary fluctuation, or the like.

When the determination result of step S704 is negative (step S706: NO), the program 212 ends the present process. When the determination result of step S706 is positive (step S706: YES), the program 212 performs the following process.

The program 212 reduces the number of target segments 353 corresponding to the processor number 351 of which the segment allocation frequency 363 is the minimum value (step S708). In addition, the program 212 increases the number of target segments 353 corresponding to the processor number 351 of which the segment allocation frequency 363 is the maximum value (step S710). Subsequently, the program 212 ends the present process.

The numbers by which the number of target segments 353 is reduced and increased may be determined based on a magnitude of the difference calculated in step S706. For example, the greater the difference, the greater the numbers by which the number of target segments 353 is reduced and increased. Conversely, the smaller the difference, the smaller the numbers by which the number of target segments 353 is reduced and increased.

The numbers by which the number of target segments 353 is reduced and increased may be the same. In other words, a sum of the numbers of target segments 353 in the cache memory area 170-1 or 170-2 of the same controller 11a or 11b may be unchanged.

Alternatively, the number of target segments 353 of all of the processors 12a-12ds may be changed as follows. The program 212 calculates an average value of the segment allocation frequency 363 corresponding to each of the processor numbers 361 of the controller number 362 that is the processing target. Subsequently, the program 212 extracts a group of records of the controller number 317 that is the processing target from the state management table 360, and divides the extracted group of records into a group of records of which the segment allocation frequency 363 is equal to or higher than the average value and a group of records of which the segment allocation frequency 363 is lower than the average value. In addition, the program 212 increases the number of target segments 353 related to the group of records of which the segment allocation frequency 363 is equal to or higher than the average value and reduces the number of target segments 353 related to the group of records of which the segment allocation frequency 363 is lower than the average value. The numbers by which the number of target segments 353 is increased and reduced may also be determined based on a magnitude of a difference between the average value and the segment allocation frequency 363.

Figure 22:
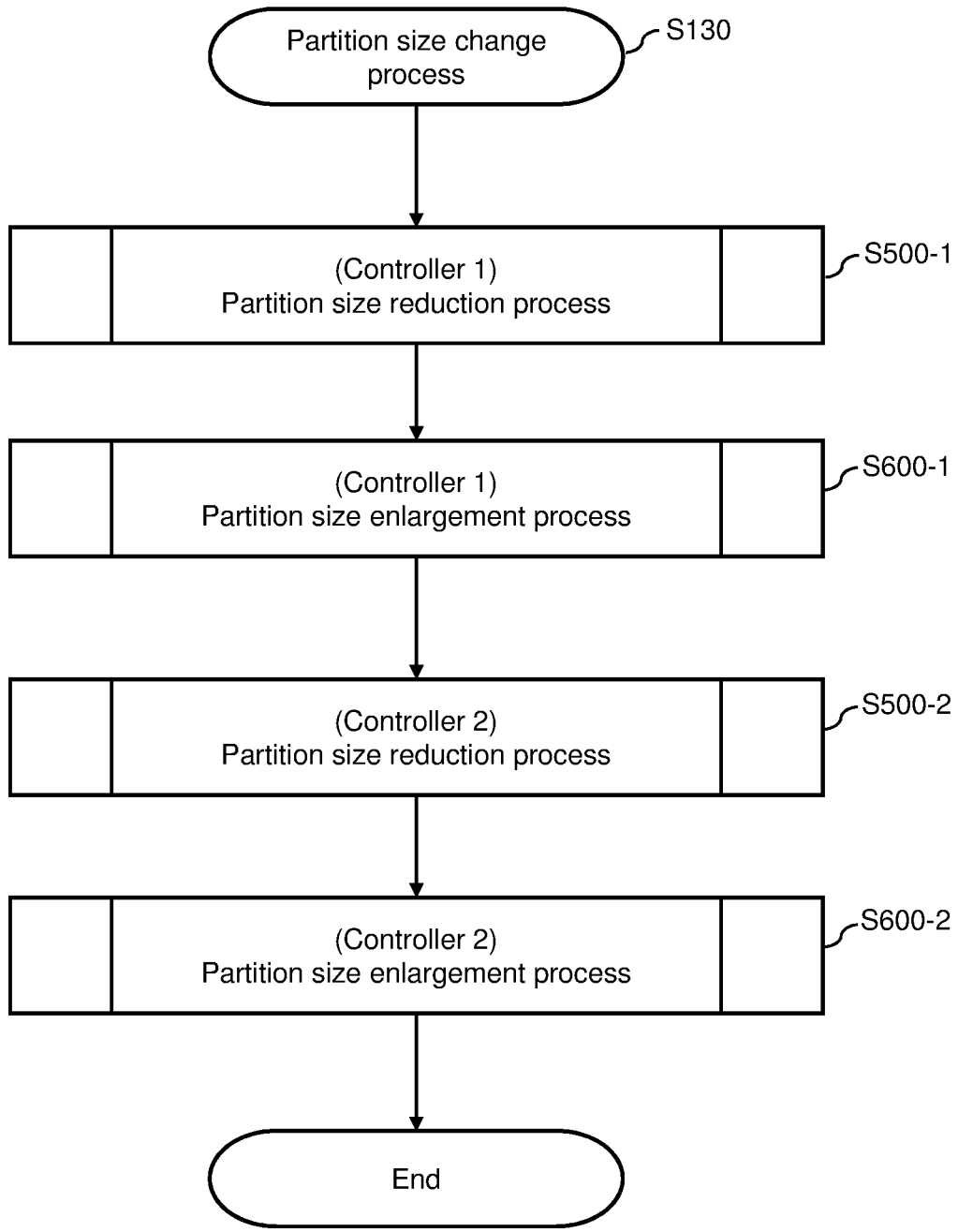
FIG. 22 is a flow chart showing a processing example of a partition change program.

FIG. 22 is a flow chart showing a processing example of the partition change program 207 executing a partition size change process (step S130).

The present process may be executed at prescribed intervals or may be executed in response to an instruction from the management computers 30. The present process may be executed asynchronously with I/O processes in order to avoid affecting the I/O processes.

The partition change program 207 executes a partition size reduction process on each partition 170-1 of the memory 13a of the controller 11a (step S500-1). In addition, the partition change program 207 executes a partition size enlargement process on each partition 170-1 of the memory 13b of the controller 11b (step S600-1).

Furthermore, the partition change program 207 executes a partition size reduction process on each partition 170-2 of the memory 13b of the controller 11b (step S500-2). In addition, the partition change program 207 executes a partition size enlargement process on each partition 170-2 of the memory 13b of the controller 11b (step S600-2).

Details of the partition size reduction process will be provided later (refer to FIG. 23). Details of the partition size enlargement process will be provided later (refer to FIG. 24).

Figure 23:
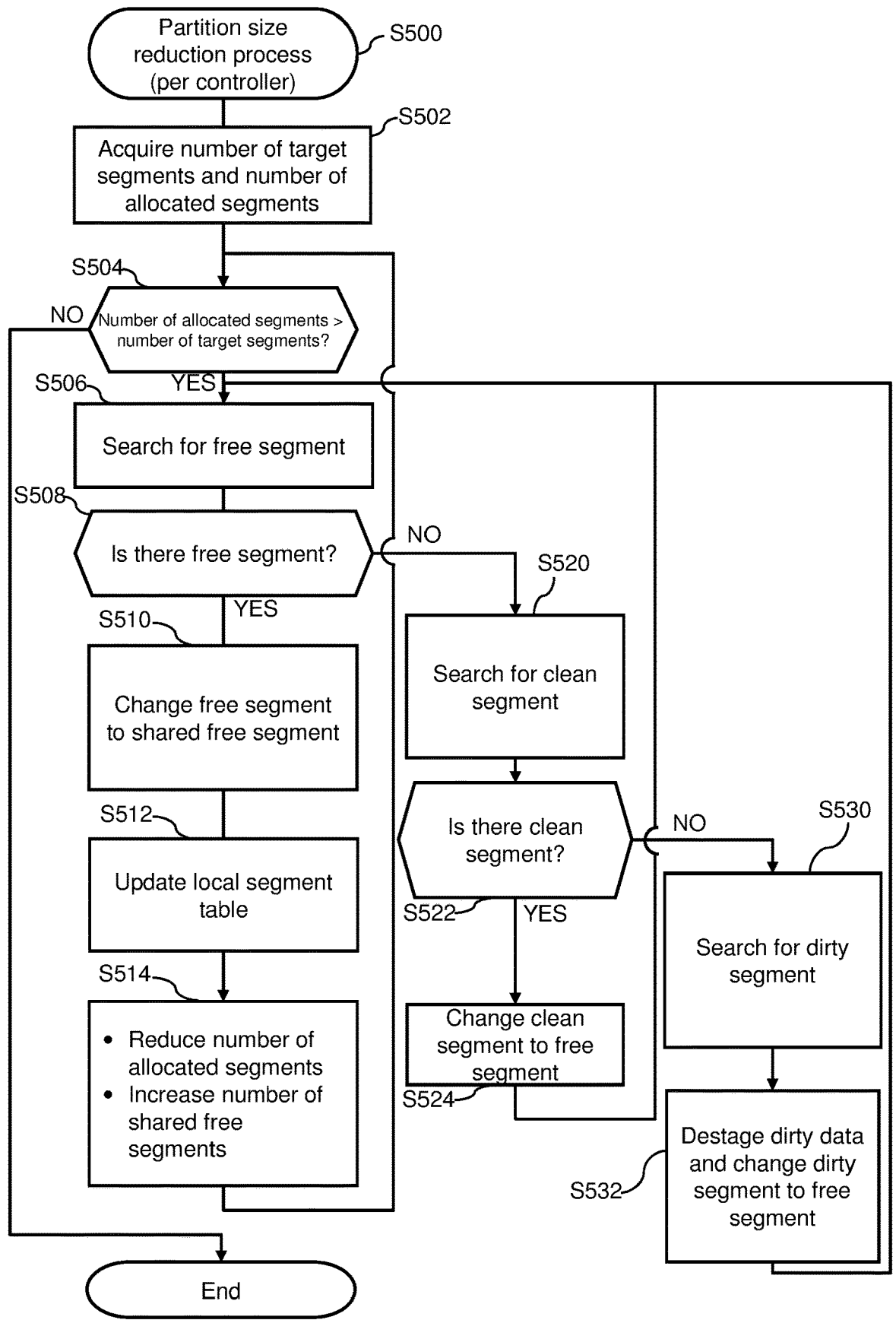
FIG. 23 is a flow chart showing a processing example of a partition reduction program.

FIG. 23 is a flow chart showing a processing example of the partition reduction program 210 executing a partition size reduction process (step S500). The present process corresponds to details of steps S500-1 and S500-2 in FIG. 22.

The partition reduction program 210 acquires the number of target segments 353 and the number of allocated segments 354 corresponding to the controller number 352 and the processor number 351 that are processing targets from the partition table 350 (step S502).

Subsequently, the program 210 determines whether or not the number of allocated segments 354 is larger than the number of target segments 353 (step S504).

When the determination result of step S504 is negative (step S504: NO), the program 210 ends the present process. When the determination result of step S504 is positive (step S504: YES), the program 210 performs the following process.

The program 210 searches for the LRU node number 325 of which the segment attribute 323 is "free" corresponding to the controller number 322 and the processor number 321 that are processing targets (in other words, of the partition 172a-1a to 172-2d that is a processing target) from the attribute table 320 (step S506). In other words, the program 210 searches for a free segment in the partition 172a-1a to 172-2d that is the processing target.

Hereinafter, a case where a free segment is discovered in the partition 172a-1a to 172-2d that is the processing target in the search performed in step S506 (step S508: YES) will be described.

The program 210 separates (dequeues) the LRU node number 325 of which the segment attribute 323 is "free" discovered in step S506 from a free queue and connects (enqueues) the LRU node number 325 to a shared free queue (step S510). In other words, the program 210 releases an allocation of a free segment allocated to one of the partitions 172a-1a to 172-2d and changes the free segment to a shared free segment. The connection to the shared free queue may be performed after an exclusive process. This is to prevent the shared free queue from being updated by another processor 12a-12d during the process.

Subsequently, the program 210 invalidates information on the segment separated from the free queue in the attribute table 320 (the local attribute table 400), the segment table 330 (the local segment table 410), and the cache directory 340 (the local cache directory 420) (step S512).

In addition, the program 210 reduces, by "1", the number of allocated segments 354 corresponding to the controller number 352 and the processor number 351 that are processing targets (in other words, of the partitions 172a-1a to 172-2d that is the processing target) in the partition table 350. Furthermore, the program 210 increases, by "1", the number of shared free segments 372 with the controller number 371 that is the processing target in the shared free table 370 (step S514). Subsequently, the program 210 returns to step S504.

Hereinafter, a case where a free segment is not discovered in the partition 172a-1a to 172-2d that is the processing target in the search performed in step S506 (step S508: NO) will be described.

The program 210 searches for the LRU node number 325 of which the segment attribute 323 is "clean" corresponding to the controller number 322 and the processor number 321 that are processing targets (in other words, of the partition 172a-1a to 172-2d that is the processing target) from the attribute table 320 (step S520). In other words, the program 210 searches for a clean segment in the partition 172a-1a to 172-2d that is the processing target.

Hereinafter, a case where a clean segment is discovered in the partition 172a-1a to 172-2d that is the processing target in the search performed in step S520 (step S522: YES) will be described.

The program 210 separates (dequeues) the LRU node number 325 of which the segment attribute 323 is "clean" discovered in step S520 from a clean queue and connects (enqueues) the LRU node number 325 to a free queue. In other words, the program 210 changes the clean segment of the partition 172a-1a to 172-2d that is the processing target to a free segment (step S524). Subsequently, the program 210 returns to step S506. In the process performed in step S510 after the return, the free segment is changed to a shared free segment.

Hereinafter, a case where a clean segment is not discovered in the partition 172a-1a to 172-2d that is the processing target in the search performed in step S520 (step S522: NO) will be described.

The program 210 searches for the LRU node number 325 of which the segment attribute 323 is "dirty" corresponding to the controller number 322 and the processor number 321 that are processing targets (in other words, of the partition 172 that is the processing target) from the attribute table 320 (step S530). In other words, the program 210 searches for a dirty segment in the partition 172a-1a to 172-2d that is the processing target. In addition, the RAID processing program 204 destages the dirty segment discovered in step S530 to a logical VOL. Subsequently, the program 210 separates (dequeues) the LRU node number 325 of which the segment attribute 323 is "dirty" discovered in step S520 from a dirty queue and connects (enqueues) the LRU node number 325 to a free queue. In other words, the program 210 changes the dirty segment of the partition 172a-1a to 172-2d that is the processing target to a free segment (step S532). Subsequently, the program 210 returns to step S510. In the process performed in step S510 after the return, the free segment is changed to a shared free segment.

According to the process described above, the allocation of the free segment allocated to the partition 172a-1a to 172-2d that is the processing target is released. In other words, the size of the partition 172a-1a to 172-2d is reduced.

Figure 24:
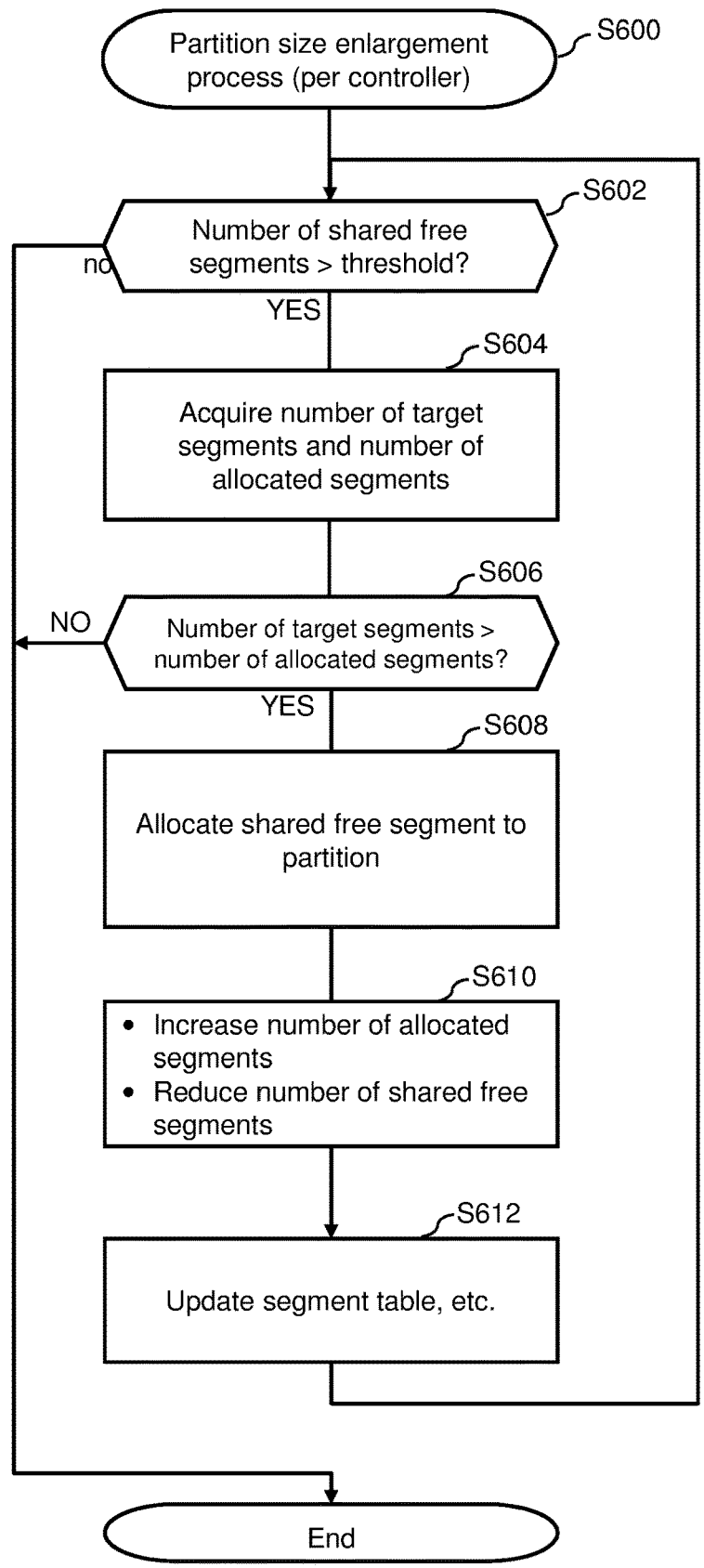
FIG. 24 is a flow chart showing a processing example of a partition enlargement program.

FIG. 24 is a flow chart showing a processing example of the partition enlargement program 208 executing a partition size enlargement process (step S600). The present process corresponds to details of steps S600-1 and S600-2 in FIG. 22.

The partition enlargement program 208 acquires the number of shared free segments 372 and the shared free segment threshold 373 corresponding to the controller number 371 that is a processing target from the shared free table 370. In addition, the program 208 determines whether or not the acquired number of shared free segments 372 is larger than the shared free segment threshold 373 (step S602).

When the determination result of step S602 is negative (step S602: NO), the program 208 ends the present process. When the determination result of step S602 is positive (step S602: YES), the program 208 performs the following process.

The program 208 acquires the number of target segments 353 and the number of allocated segments 354 corresponding to the controller number 352 and the processor number 310 that are processing targets (in other words, of the partition 172a-1a to 172-2d that is the processing target) from the segment table 350 (step S604).

Subsequently, the program 208 determines whether or not the number of target segments 353 is larger than the number of allocated segments 354 (step S606).

When the determination result of step S606 is negative (step S606: NO), the program 208 ends the present process. When the determination result of step S606 is positive (step S606: YES), the program 208 performs the following process.

The program 208 searches for the LRU node number 325 (or the MRU node number 324) of which the segment attribute 323 is "shared free" corresponding to the controller number 371 that is the processing target from the attribute table 320. In addition, the program 208 separates (dequeues) the LRU node number 325 of which the segment attribute 323 is "shared free" from a shared free queue and connects (enqueues) the LRU node number 325 to a free queue corresponding to the controller number and the processor number that are processing targets (in other words, of the partition 172a-1a to 172-2d that is the processing target) (step S608).

The program 208 updates information on the segment connected to the free queue in the attribute table 320, the segment table 330, and the cache directory 340 in the shared memory area 140. In addition, the program 208 increases, by "1", the number of allocated segments 354 corresponding to the controller number 352 and the processor number 351 that are processing targets (in other words, of the partition 172a-1a to 172-2d that is the processing target) in the partition table 350. Furthermore, the program 210 reduces, by "1", the number of shared free segments 372 with the controller number 371 that is the processing target in the shared free table 370 (step S610).

The program 208 copies records corresponding to the segment newly allocated to the partition 172a-1a to 172-2d that is the processing target in the attribute table 320, the segment table 330, and the cache directory 340 in the shared memory area 140 to the local attribute table 400, the local segment table 410, and the local cache table 420 in the local memory area 10 (step S612). Subsequently, the program 208 returns to step S602. Moreover, steps S608, S610, and S612 may be executed in any order.

According to Embodiment 1, a size of each partition 172a-1a to 172-2d is appropriately changed in the cache area 170-1 or 170-2 of the memory 13a or 13b of each controller 11a or 11b. For example, a size of the partition 172a-1a to 172-2d with a low segment allocation frequency is reduced and a size of the partition 172a-1a to 172-2d with a high segment allocation frequency is increased. Accordingly, a cache hit rate of each partition 172a-1a to 172-2d is increased. As a result, transfer of cache data between the controllers 11a and 11b may also decrease.

Embodiment 2

Figure 25:
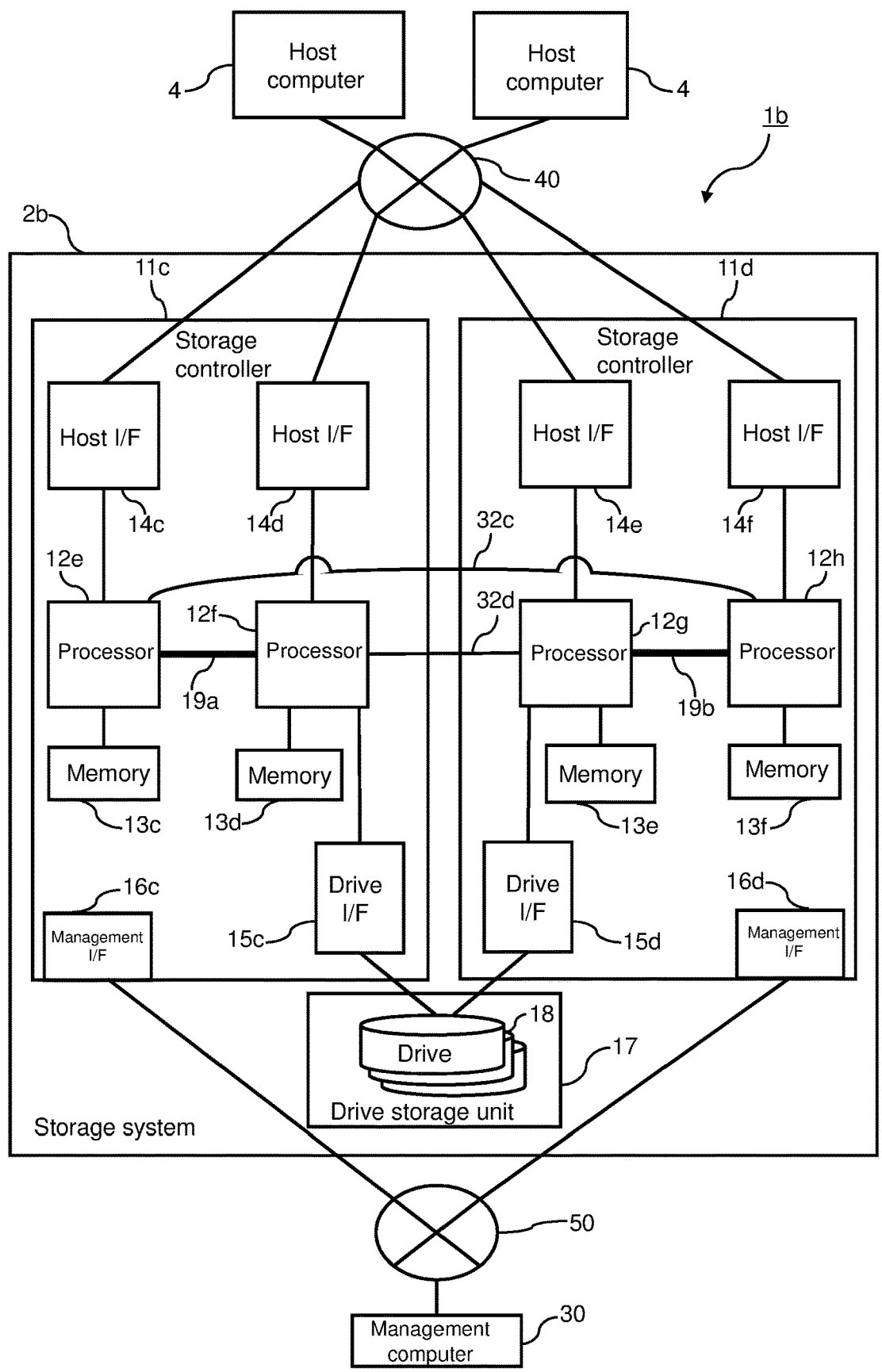
FIG. 25 shows a configuration example of a computer system according to Embodiment 2.

FIG. 25 shows a configuration example of a computer system 1b according to Embodiment 2.

The computer system 1b shown in FIG. 25 differs from the computer system 1a shown in FIG. 1 in that the computer system 1b includes two or more sets of the host I/Fs 14c-14f, the processors 12e-12h, and the memories 13c-13f in a single controller 11c or 11d. In addition, the processors 122-12h in the same controller 11c or 11d are coupled via an intra-controller inter-processor paths 19a or 19b so as to be capable of bidirectional communication. Controller 11c includes a management I/F 16c and a drive I/F 15c and controller 11d includes a management I/F 16d and a drive I/F 15d.

For example, in a same controller 11c, a processor 12e of one set is capable of not only accessing a memory 13c in the set (for example, the memory 13c directly coupled with the processor 12e) but also accessing, via an inter-processor path 19a, a memory 13d of another set. Typically, a latency of the processor 12e of one set with respect to the memory 13c in the same set as the processor 12e is less than a latency of the processor 12e of the one set with respect to the memory 13d of the other set via an intra-controller inter-processor path 19a. This is because an access speed to the memory 13d of the other set is limited by a maximum communication speed (a maximum communication bandwidth) of the inter-processor path 19a. Such an architecture is referred to as NUMA (Non-Uniform Memory Access).

Hereinafter, an access by the processor 12e to the memory 13c in the same set (the memory 13c directly coupled with the processor 12e) will be referred to as a "local access" and an access by the processor 12e to the memory 13d of the other set via the intra-controller inter-processor path 19a will be referred to as a "remote access". The same convention will apply to processors 12f, 12g, and 12h.

Typically, a local access has a higher access speed than a remote access. In other words, a latency of a local access is less than a latency of a remote access. In a similar manner, a host I/F 14c of one set is capable of accessing the memory 13c in the same set at a higher speed than accessing the memory 13d of the other set via the inter-processor path 19a.

In Embodiment 1, the number of allocated segments of the cache area 170-1 of the memory 13a included in the controller 11a and the number of allocated segments of the cache area 170-2 of the memory 13b included in the controller 11b are managed. In contrast, in Embodiment 2, the number of allocated segments of a cache area of the memory 13c in the same set as the processor 12e and the number of allocated segments of a cache area of the memory 13d in the other set are managed. A similar management method to Embodiment 1 may be used.

When the storage system 2b receives a read request from one of the host computers 4, the storage system 2b preferentially stores read data (cache data) in the memory 13c in a same set as the host I/F 14c having received the read request. In other words, a segment is preferentially allocated to a cache memory area of the memory 13c in the same set as the host I/F 14c having received the read request.

When the storage system 2b receives a write request from one of the host computers 4, the storage system 2b preferentially stores write data (cache data) in the memory 13c in a same set as the host I/F 14c having received the write request and in a memory 13f in a set including the processor 12h coupled by an inter-controller path 32c to the processor 12e in the same set as the host I/F 14c having received the write request. In other words, a segment is preferentially allocated to a cache memory area of the memory 13c in the same set as the host I/F 14c having received the write request and to the memory 13f in the set including the processor 12h coupled by the inter-controller path 32c to the processor 12e in the same set as the host I/F 14c having received the write request.

Accordingly, data transfer between the memories 13c and 13d and the host I/Fs 14c and 14d in the same controller 11c and data transfer between the memories 13c and 13d in the controller 11c and the memories 13e and 13f in the controller 11d can be optimized. In other words, data transfer on the inter-processor paths 19a and 19b in the controllers 11c and 11d and/or data transfer on the inter-controller paths 32c and 32d between the controllers 11c and 11d can be reduced.

Data transfer via the inter-processor paths 19a and 19b and data transfer via the inter-controller paths 32c and 32d are one of the factors causing response performance and throughput performance of the storage system 2b to decline. Therefore, according to the present embodiment, since data transfer via the inter-processor paths 19a and 19b and/or data transfer via the inter-controller paths 32c and 32d may be reduced, the response performance and the throughput performance of the storage system 2b may be improved.

While several embodiments have been described above, it is to be understood that the described embodiments merely represent examples for illustrating the present invention and that the scope of the present invention is not limited to the embodiments. The present invention can also be implemented in various other modes.

In Embodiment 1, the processors 12a and 12b may be examples of the first processor. The processors 12c and 12d may be examples of the second processor. The host I/F 14a may be an example of the first host interface. The host I/F 14b may be an example of the second host interface. The memory 13a may be an example of the first memory. The memory 13b may be an example of the second memory. The number of allocated segments 354 may be an example of the size of a partition. The number of target segments 353 may be an example of the target size of a partition. The segment allocation frequency 363 may be an example of the storage frequency of data with respect to a partition.

In Embodiment 2, the processors 12e and 12g may be examples of the first processor. The processors 12f and 12h may be examples of the second processor. The host I/Fs 14c and 14e may be examples of the first host interface. The host I/Fs 14d and 14f may be examples of the second host interface. The memories 13c and 13e may be examples of the first memory. The memories 13d and 13f may be examples of the second memory.

Contents according to the embodiments can also be expressed as follows.

[Expression 1]

A storage system, comprising:
first and second processors;
first and second cache memories;
first and second host interfaces capable of bidirectionally communicating with a host computer; and
a storage drive, wherein
a latency from the first host interface to the first cache memory is less than a latency from the first host interface to the second cache memory,
a latency from the second host interface to the second cache memory is less than a latency from the second host interface to the first cache memory,
each of the first and second cache memories includes: a first partition which is associated with the first processor and in which the first processor temporarily stores data relating to I/O requests processed by the first processor; and a second partition which is associated with the second processor and in which the second processor temporarily stores data relating to I/O requests processed by the second processor, and
at least one of the first and second processors is configured to independently control a size of the first partition of the first cache memory and a size of the first partition of the second cache memory and independently control a size of the second partition of the first cache memory and a size of the second partition of the second cache memory.

[Expression 2]

The storage system according to Expression 1, wherein
when the first host interface receives a read request from the host computer, a read-executing processor which processes the read request from among the first and second processors is configured to, when data relating to the read request does not exist in any of the partitions associated with the read-executing processor in the first and second cache memories, read the data relating to the read request from the storage drive, and temporarily store the read data in a partition associated with the read-executing processor in the first cache memory,
when the second host interface receives a read request from the host computer, a read-executing processor which processes the read request from among the first and second processors is configured to, when data relating to the read request does not exist in any of the partitions associated with the read-executing processor in the first and second cache memories, read the data relating to the read request from the storage drive, and temporarily store the read data in a partition associated with the read-executing processor in the second cache memory, and
at least one of the first and second processors is configured to:
change the size of the first partition of the first cache memory in accordance with a storage frequency of data with respect to the first partition of the first cache memory; and
change the size of the second partition of the second cache memory in accordance with a storage frequency of data with respect to the second partition of the second cache memory.

[Expression 3]

The storage system according to Expression 2, wherein
at least one of the first and second processors is configured to:
when enlarging the size of the first partition in the first or second cache memory, reduce the size of the second partition in the same cache memory; and when enlarging the size of the second partition in the first or second cache memory, reduce the size of the first partition in the same cache memory.

[Expression 4]

The storage system according to any of Expression 2 or 3, wherein
at least one of the first and second processors is configured to
compare a storage frequency of data with respect to the first partition with a storage frequency of data with respect to the second partition in a same cache memory, and to enlarge a size of the partition with the higher storage frequency.

[Expression 5]

The storage system according to any one of Expressions 2 to 4, wherein
at least one of the first and second processors is configured to:
based on the storage frequency of data with respect to the first partition and the storage frequency of data with respect to the second partition in the same cache memory, determine target sizes of the first and second partitions in the cache memory; and
respectively change sizes of the first and second partitions in the cache memory so that the sizes become closer to the determined target sizes of the first and second partitions.

[Expression 6]

The storage system according to Expression 5, wherein
at least one of the first and second processors is configured to
when a difference between the storage frequency of data with respect to the first partition and the storage frequency of data with respect to the second partition in the same cache memory is equal to or larger than a prescribed threshold, determine target sizes of the first and second partitions in the cache memory so that a size of the partition with a higher storage frequency is enlarged and a size of the partition with a lower storage frequency is reduced.

[Expression 7]

The storage system according to any one of Expressions 2 to 6, wherein
a segment, which is a unit of access to the cache memory, is allocated in plurality to each partition,
each cache memory includes a plurality of shared free segments, which are segments not allocated to any partition,
enlarging a size of a partition in the cache memory is to allocate a shared free segment in the same cache memory to the partition, and
reducing a size of a partition in the cache memory is to release an allocation of a segment allocated to the partition and changing the segment to a shared free segment in the same cache memory.

[Expression 8]

The storage system according to Expression 7, wherein
when the first host interface receives a write request from the host computer, a write-executing processor which processes the write request from among the first and second processors is configured to temporarily store data relating to the write request in a partition associated with the write-executing processor in the first and second cache memories,
when the second host interface receives a write request from the host computer, a write-executing processor which processes the write request from among the first and second processors is configured to temporarily store data relating to the write request in a partition associated with the write-executing processor in the first and second cache memories, and at least one of the first and second processors is configured to:

manage, for each partition of each cache memory, a dirty segment which includes data not stored in the storage drive, a clean segment which includes data already stored in the storage drive, and a free segment capable of storing new data; and manage a shared free segment for each cache memory.

[Expression 9]

The storage system according to Expression 8, wherein at least one of the first and second processors is configured to when the number of shared free segments in the cache memory is equal to or less than a threshold, change a free segment in a partition, which is a target of size reduction in the cache memory, to a shared free segment.

[Expression 10]

The storage system according to Expression 9, wherein at least one of the first and second processors is configured to when a free segment does not exist in a partition that is the target of size reduction in the cache memory, change a dirty segment or a clean segment in the partition to a free segment.

[Expression 11]

The storage system according to any one of Expressions 1 to 6, wherein a segment which is a unit of access to the cache memory is allocated in plurality to each partition, each cache memory includes a plurality of shared free segments which are segments not allocated to any partition, at least one of the first and second processors is configured to:

manage, for each partition of each cache memory, a dirty segment which includes data not stored in the storage drive, a clean segment which includes data already stored in the storage drive, and a free segment capable of storing new data; and manage a shared free segment for each cache memory, enlarging a size of a partition in the cache memory is to allocate a shared free segment in the same cache memory to the partition as a free segment, and reducing a size of a partition in the cache memory is to change a clean segment or a free segment allocated to the partition to a shared free segment in the same cache memory.

[Expression 12]

A storage control method in a computer including:

first and second processors;

first and second cache memories;

first and second host interfaces coupled with a host computer so as to be capable of bidirectional communication; and a storage drive, wherein a latency from the first host interface to the first cache memory is less than a latency from the first host interface to the second cache memory, a latency from the second host interface to the second cache memory is less than a latency from the second host interface to the first cache memory, each of the first and second cache memories includes: a first partition which is associated with the first processor and in which the first processor temporarily stores data relating to I/O requests processed by the first processor; and a second partition which is associated with the second processor and in which the second processor temporarily stores data relating to I/O requests processed by the second processor, the storage control method comprising:

causing at least one of the first and second processors to independently control a size of the first partition of the first cache memory and a size of the first partition of the second cache memory and independently control a size of the second partition of the first cache memory and a size of the second partition of the second cache memory.

[Expression 13]

The storage control method according to Expression 12, comprising causing, when the first host interface receives a read request from the host computer, a read-executing processor which processes the read request from among the first and second processors to determine whether or not data relating to the read request exists in any of the partitions associated with the read-executing processor in the first and second cache memories, and when determining that the data relating to the read request does not exist in any partition, read the data relating to the read request from the storage drive, and temporarily store the read data in a partition associated with the read-executing processor in the first cache memory, causing, when the second host interface receives a read request from the host computer, a read-executing processor which processes the read request from among the first and second processors to determine whether or not data relating to the read request exists in any of the partitions associated with the read-executing processor in the first and second cache memories, and when determining that the data relating to the read request does not exist in any partition, read the data relating to the read request from the storage drive, and temporarily store the read data in a partition associated with the read-executing processor in the second cache memory, and causing at least one of the first and second processors to:

change the size of the first partition of the first cache memory in accordance with a storage frequency of data with respect to the first partition of the first cache memory; and change the size of the second partition of the second cache memory in accordance with a storage frequency of data with respect to the second partition of the second cache memory.

The invention claimed is:

1. A storage system, comprising:
   a first controller including first processor, a first cache memory and a first host interface;
   a second controller including a second processor, a second cache memory and a second host interface; and
   a storage drive, wherein
   a latency from the first host interface to the first cache memory is less than a latency from the first host interface to the second cache memory,
   a latency from the second host interface to the second cache memory is less than a latency from the second host interface to the first cache memory,
   each of the first and second cache memories includes: a first partition which is associated with the first processor and in which the first processor temporarily and physically stores data relating to I/O requests processed by the first processor; and a second partition which is associated with the second processor and in which the second processor temporarily and physically stores data relating to I/O requests processed by the second processor,
   the first and second processors receive the I/O requests via the first and second host interfaces, respectively,
   when data relating to a received I/O request is present in at least one of the partitions of the first and second cache memories, one of the first or second processors processes the received I/O request using the first or second partition of one of the first and second cache memories which has the data relating to the received I/O request, when data relating to the received I/O request does not exist in any of the partitions of the first and second cache memories, using the first or second partition of the first cache memory when the first host interface receives the I/O request and using the first or second partition of the second cache memory when the second host interface receives the I/O request, the first processor is configured to control a size of the first partition of the first cache memory independently of a size of the first partition of the second cache memory according to a data usage frequency of the first partition of the first cache memory for physically storing data relating to the I/O requests and control the size of the first partition of the second cache memory independently of the size of the first partition of the first cache memory according to a data usage frequency of the first partition of the second cache memory for physically storing data relating to the I/O requests, and the second processor is configured to control a size of the second partition of the first cache memory independently of a size of the second partition of the second cache memory according to a data usage frequency of the second partition of the first cache memory for physically storing data relating to the I/O requests and control the size of the second partition of the second cache memory independently of the size of the second partition of the first cache memory according to a data usage frequency of the second partition of the second cache memory for physically storing data relating to the I/O requests.

2. The storage system according to claim 1, wherein when the first host interface receives a read request from the host computer, a read-executing processor which processes the read request from among the first and second processors is configured to, when data relating to the read request does not exist in any of the partitions associated with the read-executing processor in the first and second cache memories, read the data relating to the read request from the storage drive, and temporarily store the read data in a partition associated with the read-executing processor in the first cache memory, when the second host interface receives a read request from the host computer, a read-executing processor which processes the read request from among the first and second processors is configured to, when data relating to the read request does not exist in any of the partitions associated with the read-executing processor in the first and second cache memories, read the data relating to the read request from the storage drive, and temporarily store the read data in a partition associated with the read-executing processor in the second cache memory.

3. The storage system according to claim 2, wherein at least one of the first and second processors is configured to:

when enlarging the size of the first partition in the first or second cache memory, reduce the size of the second partition in the same cache memory; and when enlarging the size of the second partition in the first or second cache memory, reduce the size of the first partition in the same cache memory.

4. The storage system according to claim 2, wherein at least one of the first and second processors is configured to:

compare the data usage frequency of data with respect to the first partition with the data usage frequency of data with respect to the second partition in a same cache memory, and to enlarge a size of the partition with the higher data usage frequency.

5. The storage system according to claim 4, wherein at least one of the first and second processors is configured to:

based on the data usage frequency of data with respect to the first partition and the data usage frequency of data with respect to the second partition in the same cache memory, determine target sizes of the first and second partitions in the same cache memory; and respectively change sizes of the first and second partitions in the same cache memory so that the sizes become closer to the determined target sizes of the first and second partitions.

6. The storage system according to claim 5, wherein at least one of the first and second processors is configured to:

when a difference between the data usage frequency of data with respect to the first partition and the data usage frequency of data with respect to the second partition in the same cache memory is equal to or larger than a prescribed threshold, determine target sizes of the first and second partitions in the same cache memory so that a size of the partition with a higher data usage frequency is enlarged and a size of the partition with a lower data usage frequency is reduced.

7. The storage system according to claim 2, wherein a segment, which is a unit of access to the first or second cache memory, is allocated in plurality to each partition, each cache memory includes a plurality of shared free segments, which are segments not allocated to any partition, enlarging a size of a partition in the first or second cache memory is to allocate a shared free segment in the same cache memory to the partition, and reducing a size of a partition in the first or second cache memory is to release an allocation of a segment allocated to the partition and changing the segment to a shared free segment in the same cache memory.

8. The storage system according to claim 7, wherein when the first host interface receives a write request from the host computer, a write-executing processor which processes the write request from among the first and second processors is configured to temporarily store data relating to the write request in a partition associated with the write-executing processor in the first and second cache memories, when the second host interface receives a write request from the host computer, a write-executing processor which processes the write request from among the first and second processors is configured to temporarily store data relating to the write request in a partition associated with the write-executing processor in the first and second cache memories, and at least one of the first and second processors is configured to:

manage, for each partition of each cache memory, a dirty segment which includes data not stored in the storage drive, a clean segment which includes data already stored in the storage drive, and a free segment capable of storing new data; and manage a shared free segment for each cache memory.

9. The storage system according to claim 8, wherein
at least one of the first and second processors is configured to:
when the number of shared free segments in the first or second cache memory is equal to or less than a threshold, change a free segment in a partition, which is a target of size reduction in the first or second cache memory, to a shared free segment.

10. The storage system according to claim 9, wherein
at least one of the first and second processors is configured to:
when a free segment does not exist in a partition that is the target of size reduction in the first or second cache memory, change a dirty segment or a clean segment in the partition to a free segment.

11. The storage system according to claim 2, wherein
a segment which is a unit of access to the first and second cache memories is allocated in plurality to each partition,
each of the first and second cache memories includes a plurality of shared free segments which are segments not allocated to any partition,
at least one of the first and second processors is configured to:
manage, for each partition of each cache memory, a dirty segment which includes data not stored in the storage drive, a clean segment which includes data already stored in the storage drive, and a free segment capable of storing new data; and
manage a shared free segment for each cache memory,
enlarging a size of a partition in one of the first and second cache memories is to allocate a shared free segment in the same cache memory to the partition as a free segment, and
reducing a size of a partition in one of the first and second cache memories is to change a clean segment or a free segment allocated to the partition to a shared free segment in the same cache memory.

12. A storage control method in a computer including:
a first controller including first processor, a first cache memory and a first host interface;
a second controller including a second processor, a second cache memory and a second host interface; and
a storage drive, wherein
a latency from the first host interface to the first cache memory is less than a latency from the first host interface to the second cache memory,
a latency from the second host interface to the second cache memory is less than a latency from the second host interface to the first cache memory,
each of the first and second cache memories includes: a first partition which is associated with the first processor and in which the first processor temporarily and physically stores data relating to I/O requests processed by the first processor; and a second partition which is associated with the second processor and in which the second processor temporarily and physically stores data relating to I/O requests processed by the second processor,
the storage control method comprising:
receiving, by the first and second processors, the I/O requests via the first and second host interfaces, respectively,
when data relating to a received I/O request is present in at least one of the partitions of the first and second cache memories, processing, by one of the first or second processors, the received I/O request using the first or second partition of one of the first and second cache memories which has the data relating to the received I/O request,
when data relating to the received I/O request does not exist in any of the partitions of the first and second cache memories, processing the received I/O request using the first or second partition of the first cache memory when the first host interface receives the I/O request and processing the received I/O request using the first or second partition of the second cache memory when the second host interface receives the I/O request, and
causing the first processor to control a size of the first partition of the first cache memory independently of a size of the first partition of the second cache memory for physically storing data relating to I/O requests according to a data usage frequency of the first partition of the first cache memory and control the size of the first partition of the second cache memory independently of the size of the first partition of the first cache memory according to a data usage frequency of the first partition of the second cache memory for physically storing data relating to I/O requests, and
the second processor to control a size of the second partition of the first cache memory independently of a size of the second partition of the second cache memory independently according to a data usage frequency of the second partition of the first cache memory for physically storing data relating to I/O requests and control the size of the second partition of the second cache memory independently of the size of the second partition of the first cache memory according to a data usage frequency of the second partition of the second cache memory for physically storing data relating to I/O requests.

13. The storage control method according to claim 12, comprising
causing, when the first host interface receives a read request from the host computer, a read-executing processor which processes the read request from among the first and second processors to determine whether or not data relating to the read request exists in any of the partitions associated with the read-executing processor in the first and second cache memories, and when determining that the data relating to the read request does not exist in any partition, read the data relating to the read request from the storage drive, and temporarily store the read data in a partition associated with the read-executing processor in the first cache memory,
causing, when the second host interface receives a read request from the host computer, a read-executing processor which processes the read request from among the first and second processors to determine whether or not data relating to the read request exists in any of the partitions associated with the read-executing processor in the first and second cache memories, and when determining that the data relating to the read request does not exist in any partition, read the data relating to the read request from the storage drive, and temporarily store the read data in a partition associated with the read-executing processor in the second cache memory.

* * * * *